US011631686B2

(12) United States Patent
Said et al.

(10) Patent No.: US 11,631,686 B2
(45) **Date of Patent: *Apr. 18, 2023**

(54) THREE-DIMENSIONAL MEMORY ARRAY INCLUDING DUAL WORK FUNCTION FLOATING GATES AND METHOD OF MAKING THE SAME

(71) Applicant: SANDISK TECHNOLOGIES LLC, Addison, TX (US)

(72) Inventors: Ramy Nashed Bassely Said, San Jose, CA (US); Yanli Zhang, San Jose, CA (US); Jiahui Yuan, Fremont, CA (US); Raghuveer S. Makala, Campbell, CA (US); Senaka Kanakamedala, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/351,720

(22) Filed: Jun. 18, 2021

(65) Prior Publication Data

US 2022/0254798 A1 Aug. 11, 2022

Related U.S. Application Data

(63) Continuation-in-part of application No. 17/169,987, filed on Feb. 8, 2021, now Pat. No. 11,482,531.

(51) Int. Cl.
*H01L 29/49* (2006.01)
*H01L 27/11556* (2017.01)

(52) U.S. Cl.
CPC .... *H01L 27/11556* (2013.01); *H01L 29/4966* (2013.01)

(58) Field of Classification Search
CPC ...................... H01L 27/11556; H01L 29/4966
See application file for complete search history.

(56) References Cited

U.S. PATENT DOCUMENTS 8,349,681 B2 1/2013 Alsmeier et al.
8,658,499 B2 2/2014 Makala et al.
(Continued)

OTHER PUBLICATIONS

Eitan, B. et al., “4-bit per cell NROM reliability,” IEEE International Electron Devices Meeting, 2005. IEDM Technical Digest. IEEE, (2005).

(Continued)

*Primary Examiner* — Eugene Lee
(74) *Attorney, Agent, or Firm* — The Marbury Law Group PLLC

(57) ABSTRACT

A three-dimensional memory device includes an alternating stack of insulating layers and electrically conductive layers, memory opening fill structures extending through the alternating stack, where each of the memory opening fill structures includes a vertical semiconductor channel, a tunneling dielectric layer, and a vertical stack of memory elements located at levels of the electrically conductive layers between a respective vertically neighboring pair of the insulating layers. Each of the memory elements is located at a level of a respective one of the electrically conductive layers between the respective vertically neighboring pair of the insulating layers. Each of the memory elements includes a first memory material portion, and a second memory material portion that is vertically spaced from the first memory material portion. The second memory material portion has a different material composition from the first memory material portion.

15 Claims, 31 Drawing Sheets

(56) References Cited

U.S. PATENT DOCUMENTS

| | | | |
|---|---|---|---|
| 9,252,151 | B2 | 2/2016 | Chien et al. |
| 9,356,031 | B2 | 5/2016 | Lee et al. |
| 9,397,093 | B2 | 7/2016 | Makala et al. |
| 9,419,012 | B1 | 8/2016 | Shimabukuro et al. |
| 9,576,975 | B2 | 2/2017 | Zhang et al. |
| 9,620,514 | B2 | 4/2017 | Kai et al. |
| 9,627,399 | B2 | 4/2017 | Kanakamedala et al. |
| 9,659,955 | B1 | 5/2017 | Sharangpani et al. |
| 9,666,594 | B2 | 5/2017 | Mizuno et al. |
| 9,728,546 | B2 | 8/2017 | Serov et al. |
| 9,837,431 | B2 | 12/2017 | Nishikawa et al. |
| 9,875,929 | B1 | 1/2018 | Shukla et al. |
| 9,935,123 | B2 | 4/2018 | Nishikawa et al. |
| 9,935,124 | B2 | 4/2018 | Nishikawa et al. |
| 9,991,277 | B1 | 6/2018 | Tsutsumi et al. |
| 10,115,897 | B1 | 10/2018 | Sato |
| 10,249,683 | B1 | 4/2019 | Lille et al. |
| 10,373,696 | B2 | 8/2019 | Zhang et al. |
| 10,381,376 | B1 | 8/2019 | Nishikawa et al. |
| 10,516,025 | B1 | 12/2019 | Nishikawa et al. |
| 10,559,588 | B2 | 2/2020 | Dong et al. |
| 10,593,693 | B2 | 3/2020 | Yamazaki et al. |
| 10,622,368 | B2 | 4/2020 | Kanakamedala et al. |
| 10,700,078 | B1 | 6/2020 | Cui et al. |
| 10,700,086 | B2 | 6/2020 | Makala et al. |
| 10,700,090 | B1 | 6/2020 | Cui et al. |
| 10,720,444 | B2 | 7/2020 | Nishikawa et al. |
| 10,950,627 | B1 | 3/2021 | Hinoue et al. |
| 10,985,171 | B2 | 4/2021 | Kaneko |
| 11,018,151 | B2 | 5/2021 | Kaneko |
| 11,121,140 | B2 | 9/2021 | Yang et al. |
| 2006/0263963 | A1 | 11/2006 | Hu |
| 2014/0131784 | A1* | 5/2014 | Davis .................... H01L 29/792 438/589 |
| 2014/0225181 | A1 | 8/2014 | Makala et al. |
| 2015/0132906 | A1 | 5/2015 | Chang et al. |
| 2015/0287734 | A1 | 10/2015 | Simek-Ege et al. |
| 2016/0043093 | A1 | 2/2016 | Lee et al. |
| 2016/0071860 | A1 | 3/2016 | Kai et al. |
| 2016/0071861 | A1 | 3/2016 | Serov et al. |
| 2016/0071876 | A1 | 3/2016 | Mizuno et al. |
| 2016/0155511 | A1* | 6/2016 | Aritome ............ H01L 27/11556 365/185.28 |
| 2017/0025431 | A1 | 1/2017 | Kanakamedala et al. |
| 2017/0125436 | A1 | 5/2017 | Sharangpani et al. |
| 2017/0148805 | A1 | 5/2017 | Nishikawa et al. |
| 2017/0148808 | A1 | 5/2017 | Nishikawa et al. |
| 2017/0148809 | A1 | 5/2017 | Nishikawa et al. |
| 2017/0200801 | A1* | 7/2017 | Hopkins ........... H01L 29/40114 |
| 2018/0138194 | A1 | 5/2018 | Shigemura et al. |
| 2018/0151588 | A1 | 5/2018 | Tsutsumi et al. |
| 2019/0074441 | A1 | 3/2019 | Kikuchi et al. |
| 2019/0214395 | A1 | 7/2019 | Zhang et al. |
| 2019/0221575 | A1 | 7/2019 | Dong et al. |
| 2019/0252405 | A1 | 8/2019 | Tsutsumi et al. |
| 2019/0371803 | A9 | 12/2019 | Kanakamedala et al. |
| 2019/0386108 | A1 | 12/2019 | Nishikawa |
| 2020/0006375 | A1 | 1/2020 | Zhou et al. |
| 2020/0006376 | A1 | 1/2020 | Makala et al. |
| 2020/0058672 | A1 | 2/2020 | Nishikawa et al. |
| 2020/0227432 | A1 | 7/2020 | Lai et al. |
| 2020/0286902 | A1* | 9/2020 | Fukuda ............. H01L 27/11582 |

OTHER PUBLICATIONS

Eitan, B. et al., "NROM: A novel localized trapping, 2-bit nonvolatile memory cell," IEEE Electron Device Letters 21.11, pp. 543-545, (2000).
Endoh et al., "Novel Ultra High Density Memory with a Stacked-Surrounding Gate Transistor (S-SGT) Structured Cell," IEDM Proc. (2001) 33-36.
Krauss, T. et al., "Dual Metal-Gate Planar Field-Effect Transistor for Electrostatically Doped CMOS Design," *Technische Universität Darmstadt*, May 2014, arXiv, Project: Dehancement Mode Field Effect Transistor (DeFET) Devices.
Polishchuk, I. et al., "Dual Work Function Metal Gate CMOS Technology Using Metal Interdiffusion," *IEEE Electron Device Letters*, vol. 22, No. 9, pp. 444-446, Sep. 2001, doi: 10.1109/55.944334.
Yang, X., et al. "Dry etching of Al2O3 thin films in O2/BCI3/Ar inductively coupled plasma," Trans. Electr. Electron. Mater 11.5, pp. 202-205, (2010).
U.S. Appl. No. 16/582,262, filed Sep. 25, 2019, SanDisk Technologies LLC.
U.S. Appl. No. 16/794,536, filed Feb. 19, 2020, SanDisk Technologies LLC.
U.S. Appl. No. 16/794,563, filed Feb. 19, 2020, SanDisk Technologies LLC.
U.S. Appl. No. 16/801,456, filed Feb. 26, 2020, SanDisk Technologies LLC.
U.S. Appl. No. 16/849,600, filed Apr. 15, 2020, SanDisk Technologies LLC.
U.S. Appl. No. 16/849,664, filed Apr. 15, 2020, SanDisk Technologies LLC.
U.S. Appl. No. 16/876,816, filed May 18, 2020, SanDisk Technologies LLC.
U.S. Appl. No. 16/876,877, filed May 18, 2020, SanDisk Technologies LLC.
U.S. Appl. No. 16/985,335, filed Aug. 5, 2020, SanDisk Technologies LLC.
U.S. Appl. No. 17/001,003, filed Aug. 24, 2020, SanDisk Technologies LLC.
U.S. Appl. No. 17/090,420, filed Nov. 5, 2020, SanDisk Technologies LLC.
U.S. Appl. No. 17/119,002, filed Dec. 11, 2020, SanDisk Technologies LLC.
U.S. Appl. No. 17/119,051, filed Dec. 11, 2020, SanDisk Technologies LLC.
U.S. Appl. No. 17/122,360, filed Dec. 15, 2020, SanDisk Technologies LLC.
U.S. Appl. No. 17/169,987, filed Feb. 8, 2021, SanDisk Technologies LLC.
Notification of Transmittal of the International Search Report and the Written Opinion of the International Searching Authority for International Patent Application No. PCT/US2021/037288, dated Nov. 1, 2021, 8 pages.
USPTO Office Communication, Notice of Allowance and Fee(s) due for U.S. Appl. No. 17/168,987, dated Jun. 22, 2022, 16 pages.

* cited by examiner

THREE-DIMENSIONAL MEMORY ARRAY INCLUDING DUAL WORK FUNCTION FLOATING GATES AND METHOD OF MAKING THE SAME

FIELD

The present disclosure relates generally to the field of semiconductor devices, and particularly to a three-dimensional memory array including dual work function floating gates and methods of manufacturing the same.

BACKGROUND

A three-dimensional memory array can provide high density memory bits that may be used in a storage class memory (SCM) device. Vertical stacks of memory elements can be arranged as a two-dimensional array to provide a three-dimensional memory array. Three-dimensional memory arrays include NAND arrays and NOR arrays.

SUMMARY

According to an aspect of the present disclosure, a three-dimensional memory device includes an alternating stack of insulating layers and electrically conductive layers, memory opening fill structures extending through the alternating stack, where each of the memory opening fill structures includes a vertical semiconductor channel, a tunneling dielectric layer, and a vertical stack of memory elements located at levels of the electrically conductive layers between a respective vertically neighboring pair of the insulating layers. Each of the memory elements is located at a level of a respective one of the electrically conductive layers between the respective vertically neighboring pair of the insulating layers. Each of the memory elements includes a first memory material portion, and a second memory material portion that is vertically spaced from the first memory material portion. The second memory material portion has a different material composition from the first memory material portion.

According to another aspect of the present disclosure, a method of forming a semiconductor structure is provided, which comprises: forming a vertical repetition of a unit layer stack over a substrate, wherein the unit layer stack comprises a first sacrificial material layer, a second sacrificial material layer, and an insulating layer; forming memory openings through the vertical repetition; forming first lateral recesses by laterally recessing each of the first sacrificial material layers around each of the memory openings; forming first memory material portions comprising a first memory material in the first lateral recesses; forming second lateral recesses by laterally recessing each of the second sacrificial material layers around each of the memory openings after forming the first memory material portions; forming second memory material portions comprising a second memory material in the second lateral recesses, wherein a vertical stack of memory elements is formed around each memory opening, each of the memory elements comprising a respective first memory material portion and a respective second memory material portion; forming a semiconductor channel over a respective vertical stack of memory elements in each memory opening; forming source pillar structures and drain pillar structures through the vertical repetition, wherein each of the semiconductor channels contacts a respective source pillar structure and a respective drain pillar structure; and replacing remaining portions of the first sacrificial material layers and the second sacrificial material layers with electrically conductive strips.

BRIEF DESCRIPTION OF THE DRAWINGS

Figures with a same figure numeral refer to a same structure. Each figure with an alphabetical figure suffix A is a top-down view, i.e., a plan view. For example, FIGS. 1A, 2A, 3A, etc. are top-down views. Each figure with an alphabetical suffix B is a vertical cross-sectional view along the vertical plane B-B' in the figure within the same figure numeral and with the alphabetical suffix A. Each figure with an alphabetical suffix C is a vertical cross-sectional view along the vertical plane C-C' in the figure within the same figure numeral and with the alphabetical suffix A. Each figure with an alphabetical suffix D is a vertical cross-sectional view along the vertical plane D-D' in the figure within the same figure numeral and with the alphabetical suffix A. For example.

FIGS. 1A-1D are various views of an exemplary structure after formation of first access lines according to an embodiment of the present disclosure.

DETAILED DESCRIPTION

Figure 1B:
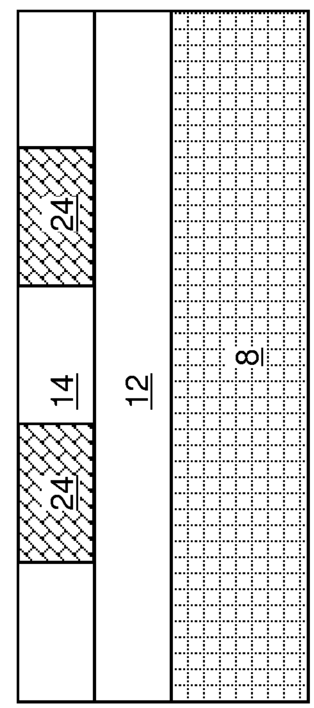
FIG. 1B is a vertical cross-sectional view along the plane B-B' of FIG. 1A.
Figure 1A:
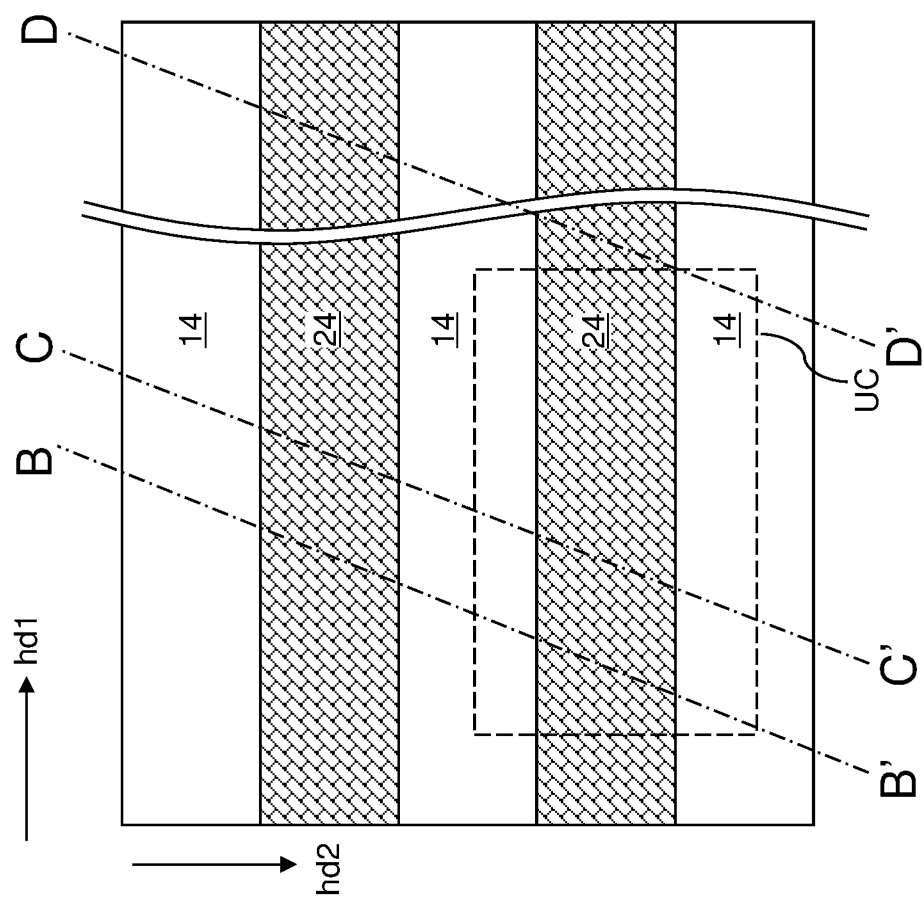
Figure 1C:
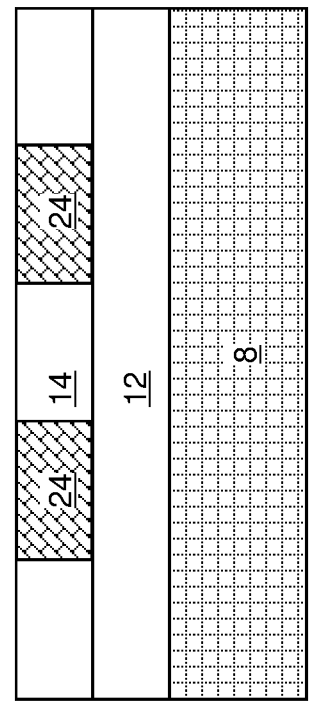
FIG. 1C is a vertical cross-sectional view along the plane C-C' of FIG. 1A.
Figure 1D:
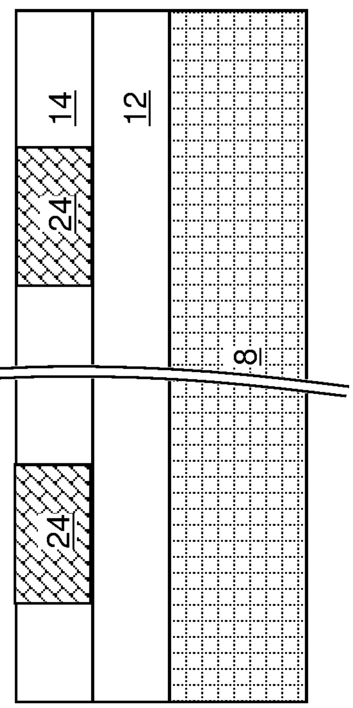
FIG. 1D is a vertical cross-sectional view along the plane D-D' of FIG. 1A. Some structures are illustrated with a top-down view and three vertical cross-sectional views, and some other structures are illustrated with a top-down view and two vertical cross-sectional views.
Figure 2B:
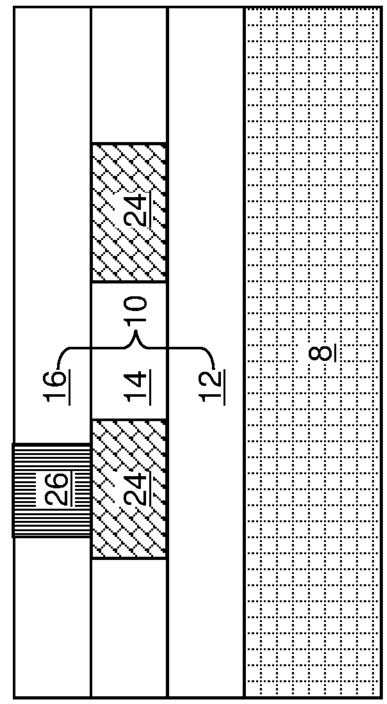
FIGS. 2A-2D are various views of the exemplary structure after formation of first connection via structures according to an embodiment of the present disclosure.
Figure 2A:
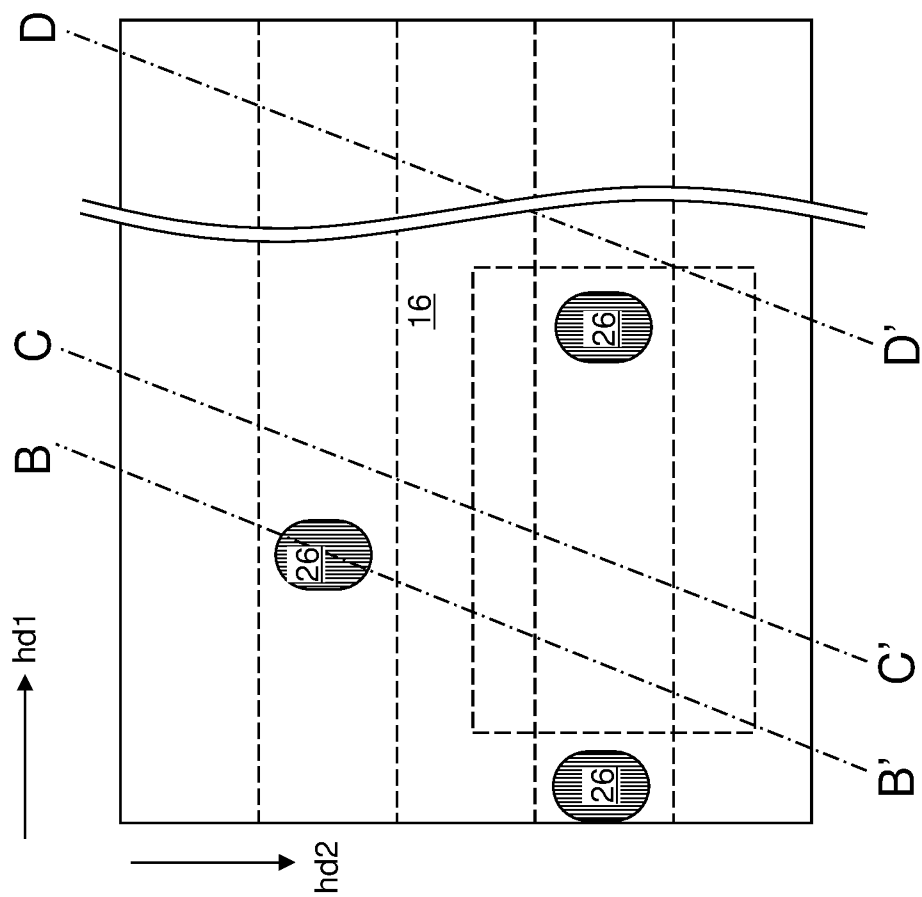
Figure 2C:
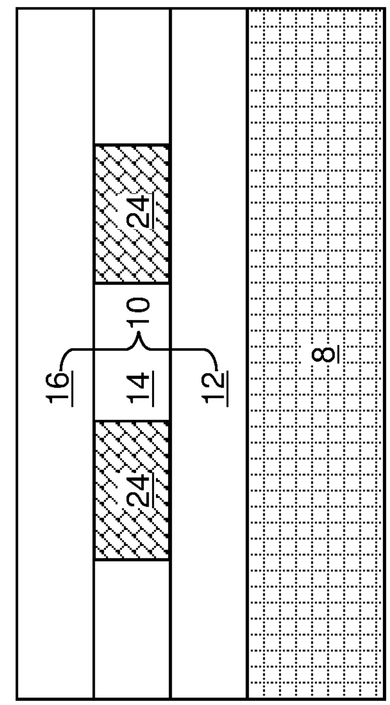
Figure 2D:
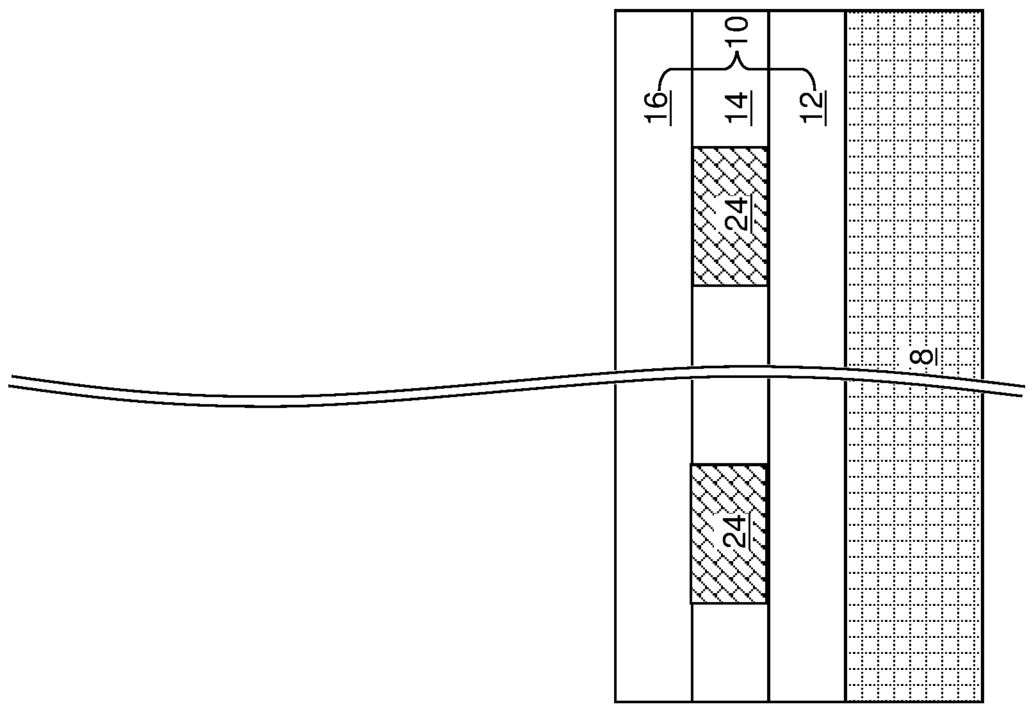
Figures 3A, 3B:
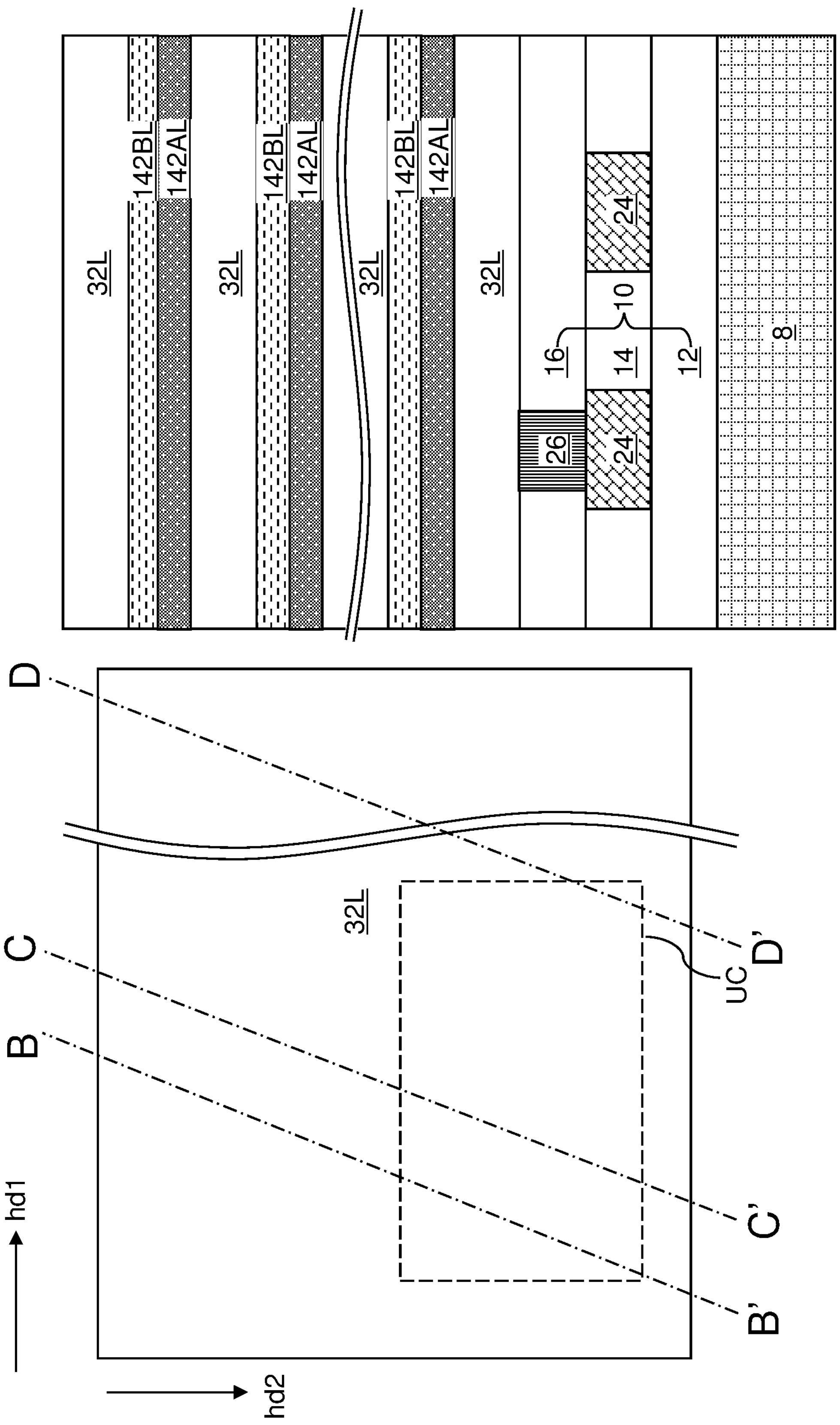
FIGS. 3A-3D are various views of the exemplary structure after formation of a vertical repetition of a unit layer stack comprising a first sacrificial material layer, a second sacrificial material layer, and an insulating layer according to an embodiment of the present disclosure.
Figure 3C:
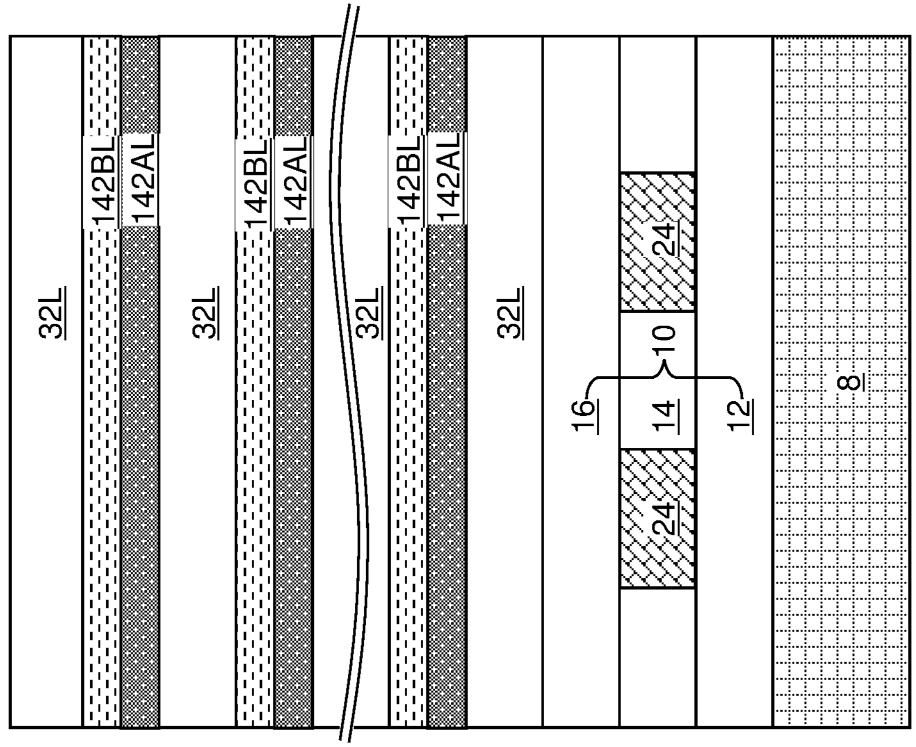
Figure 3D:
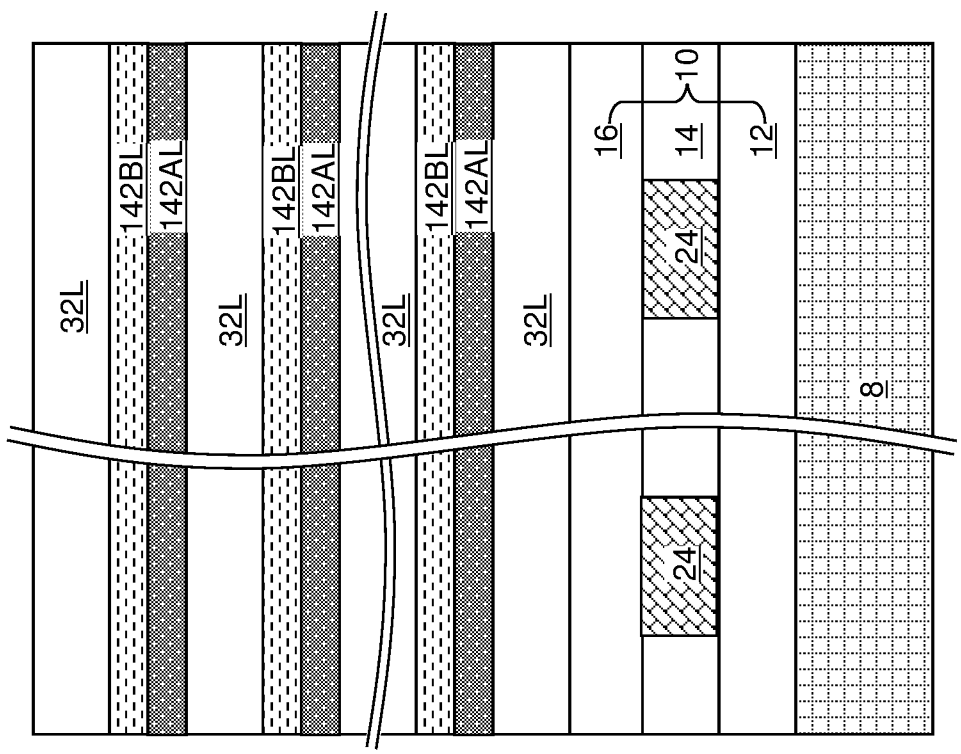
Figures 4A, 4B:
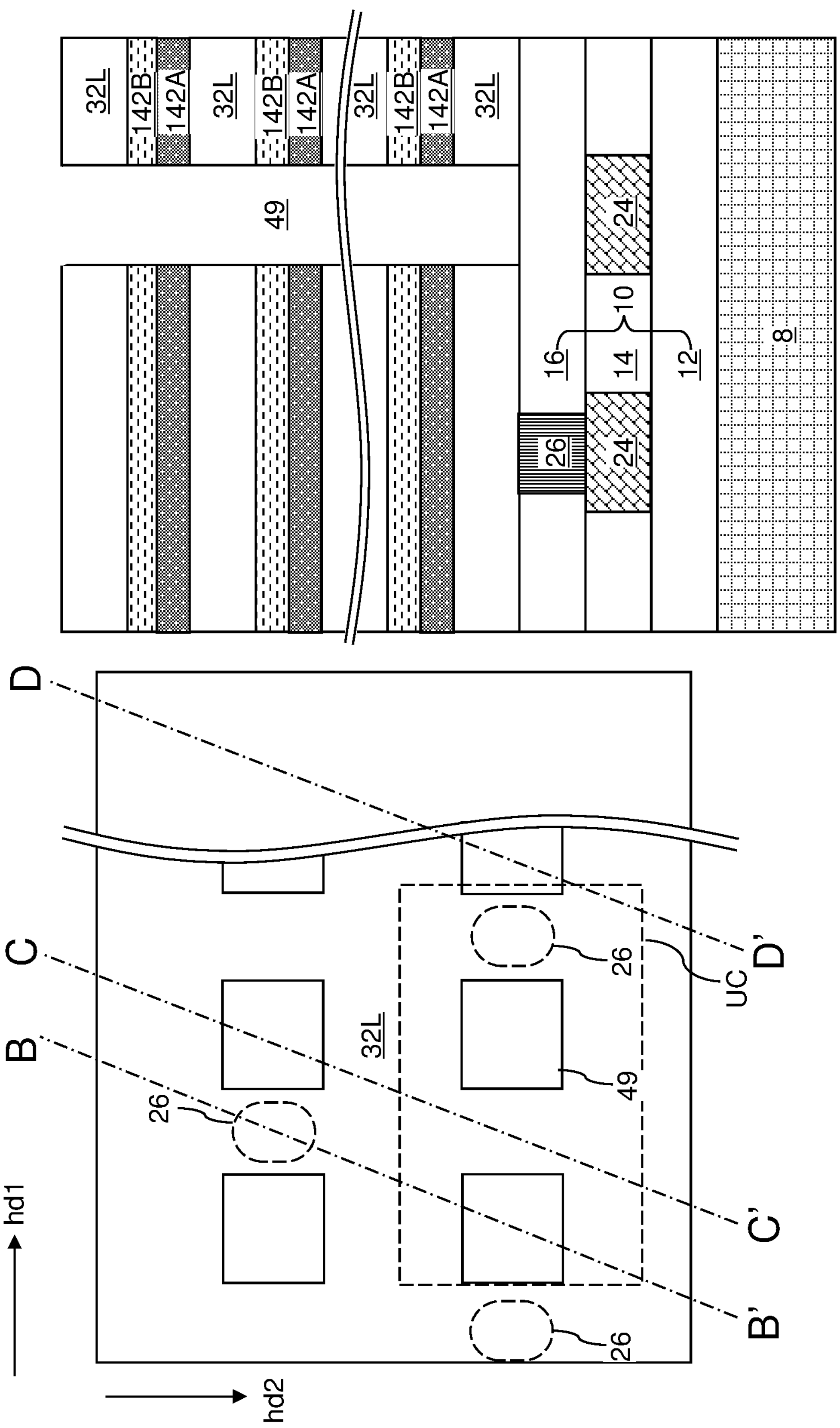
FIGS. 4A-4D are various views of the exemplary structure after formation of memory openings according to an embodiment of the present disclosure.
Figure 4C:
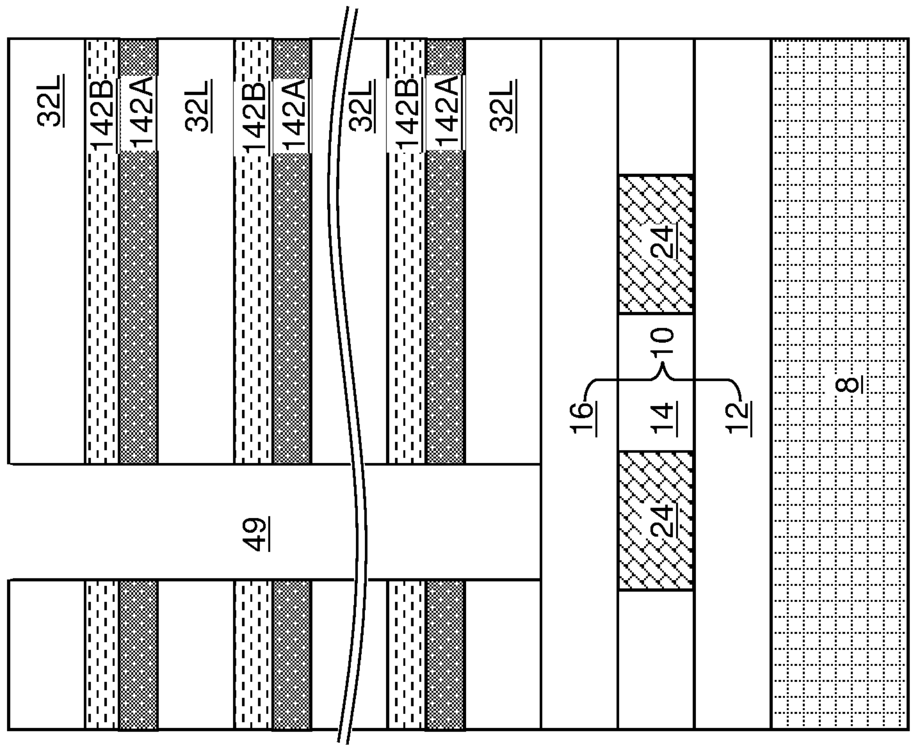
Figure 4D:
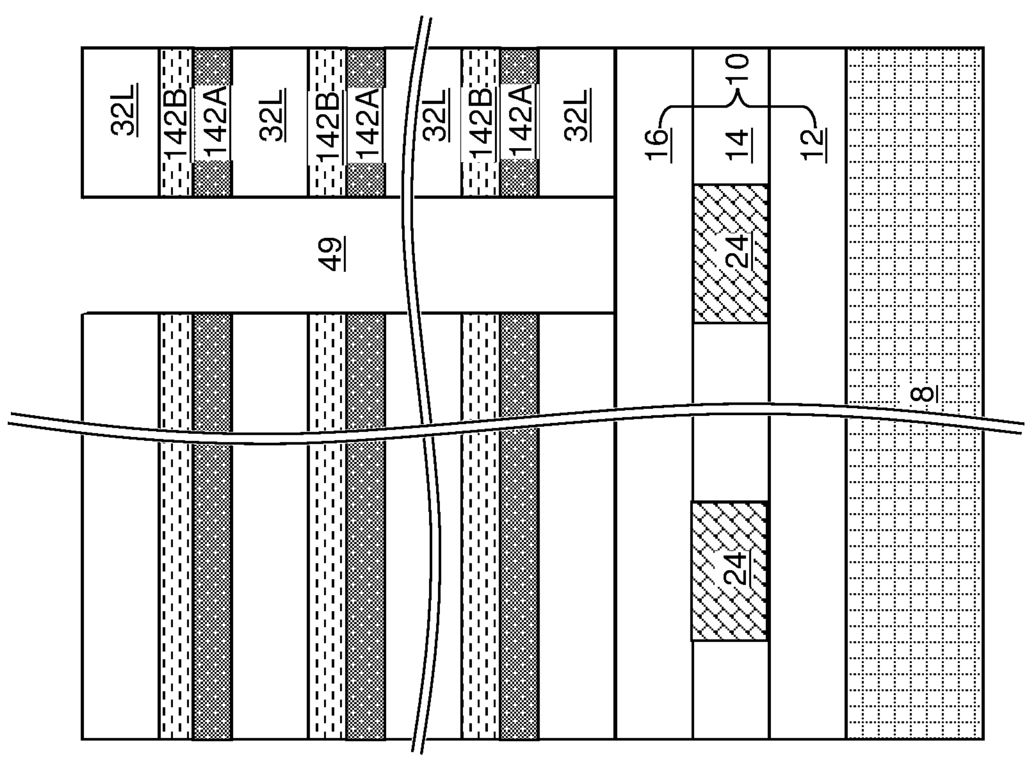

As discussed above, embodiments of the present disclosure are directed to a three-dimensional memory device containing a vertical stack of memory elements located at levels of the electrically conductive layers, such as word lines. The memory elements may comprise dual work function floating gates located at the levels of each of the word lines. In one embodiment, the dual work function floating gates improve at least one of device endurance, channel hot electron injection and the channel's hot-carrier programming characteristics.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Referring to FIGS. 1A-1D, an exemplary structure according to an embodiment of the present disclosure is illustrated. The exemplary structure comprises a substrate 8, which can be a semiconductor substrate such as a commercially available silicon wafer. Optionally, semiconductor devices (not shown) such as complementary metal-oxide-semiconductor (CMOS) transistors can be formed on the top surface of the substrate 8. The CMOS transistors can include a control (i.e., driver) circuit for controlling a NOR memory array or a NAND memory array to be subsequently formed thereabove.

An insulating spacer layer 12 can be formed above the substrate 8. In case semiconductor devices are formed on the top surface of the substrate 8, the insulating spacer layer 12 can be formed above such semiconductor devices (such as field effect transistors). A first line-level dielectric layer 14 can be formed above the insulating spacer layer 12. The first line-level dielectric layer 14 includes a dielectric material such as silicon oxide, and can have a thickness in a range from 50 nm to 500 nm. Line cavities laterally extending along a first horizontal direction hd1 can be formed through the first line-level dielectric layer 14. At least one conductive material can be deposited in the line cavities, and excess portions of the at least one conductive material can be removed from above the horizontal plane including the top surface of the first line-level dielectric layer 14. Remaining portions of the at least one conductive material comprise first access lines 24. The first access lines 24 can function as source lines or bit lines for a three-dimensional NOR memory array to be subsequently formed. In one embodiment, the first access lines 24 function as source lines.

The first access lines 24 are parallel to each other, and laterally extend along a first lengthwise direction, which can be the first horizontal direction hd1. The first access lines 24 can have a same line width along a second horizontal direction hd2, which is perpendicular to the first horizontal direction hd1. The first access lines 24 can be formed as a one-dimensional periodic array having a periodicity along the second horizontal direction hd2. Memory cells can be subsequently formed over the first access lines 24. The exemplary structure can be employed to form a three-dimensional memory array having a two-dimensional periodicity along horizontal directions. The area of a unit cell UC, which is a unit structure that is repeated within the three-dimensional memory array, is illustrated in the top-down view of FIG. 1A.

Referring to FIGS. 2A-2D, a first via-level dielectric layer 16 can be formed above the first line-level dielectric layer 14. The first via-level dielectric layer 16 includes a dielectric material such as silicon oxide, and may have a thickness in a range from 50 nm to 500 nm. Via cavities can be formed through the first via-level dielectric layer 16. At least one conductive material can be deposited in the via cavities, and excess portions of the at least one conductive material can be removed from above the horizontal plane including the top surface of the first via-level dielectric layer 16. Remaining portions of the at least one conductive material comprise first connection via structures 26. Each first connection via structure 26 can be formed on a top surface of a respective one of the first access lines 24. The first connection via structure 26 can function as source connection via structures if the first access lines 24 function as source lines, or as drain connection via structures if the first access lines 24 function as drain lines. The layer stack of the insulating spacer layer 12, the first line-level dielectric layer 14, and the first via-level dielectric layer 16 is herein referred to as underlying insulating layers 10.

Referring to FIGS. 3A-3D, a vertical repetition of a unit layer stack (32, 142A, 142B) can be formed over the over the underlying insulating layers 10. Each unit layer stack (32, 142A, 142B) can include, from bottom to top, an insulating layer 32L, a first sacrificial material layer 142A, and a second sacrificial material layer 142B. Alternatively, each unit layer stack (32, 142A, 142B) can include, from bottom to top, an insulating layer 32L, a second sacrificial material layer 142B, and a first sacrificial material layer 142A. Yet alternatively, each unit layer stack (32, 142A, 142B) can include, from bottom to top, a first sacrificial material layer 142A, a second sacrificial material layer 142B, and an insulating layer 32L. Still alternatively, each unit layer stack (32, 142A, 142B) can include, from bottom to top, a second sacrificial material layer 142B, a first sacrificial material layer 142A, and an insulating layer 32L. Generally, the materials of the first sacrificial material layers 142A, and the second sacrificial material layers 142B are different from the material of the insulating layers 32L, and are selected such that the first sacrificial material layers 142A and the second sacrificial material layers 142B can be removed selective to the material of the insulating layers 32L. Further, the first sacrificial material of the first sacrificial material layers 142A can be different from the second sacrificial material of the second sacrificial material layers 142B such that the first sacrificial material can be subsequently removed selective to the second sacrificial material during a subsequent isotropic etch process. As used herein, a first material is removed "selective to" a second material if the removal rate of the first material is greater than the removal rate of the second material at least by a factor of 3.

In one embodiment, the insulating layers 32L can include undoped silicate glass or a doped silicate glass, the first sacrificial material layers 142A can include a first silicon nitride material providing a higher etch rate in an etchant, and the second sacrificial material layers 142B can include a second silicon nitride material providing a lower etch rate in the same etchant. For example, the first sacrificial material layers 142A may include a more porous silicon nitride material having a density in a range from 2.34 $g/cm^3$ to 2.58 $g/cm^3$. Such a porous silicon nitride material may be deposited by a plasma enhanced chemical vapor deposition process in which a higher plasma power is employed, can have a refractive index in a range from 1.74 to 1.90, and can have an etch rate in a range from 5 nm/min to 90 nm/min in a 100:1 dilute hydrofluoric acid at room temperature. In contrast, the second sacrificial material layers 142B include a non-porous silicon nitride material or a less porous silicon nitride material having a greater density than the more porous silicon nitride material of the first sacrificial silicon material layers 142A. In one embodiment, the second sacrificial material layers 142B can have a density in a range from 2.45 $g/cm^3$ to 2.65 $g/cm^3$, such as from 2.59 $g/cm^3$ to 2.65 $g/cm^3$. Such non-porous silicon nitride material may be deposited by a plasma enhanced chemical vapor deposition process in which a lower plasma power is employed, can have a refractive index in a range from 1.82 to 1.94, and can have an etch rate in a range from 2.5 nm/min to 25 nm/min, such as from 2.5 nm/min to 5 nm/min, in a 100:1 dilute hydrofluoric acid at room temperature.

In another embodiment, the insulating layers 32L can include undoped silicate glass or a doped silicate glass, the first sacrificial material layers 142A can include a first semiconductor material providing a first etch rate in an isotropic etchant such as hot trimethyl-2 hydroxyethyl ammonium hydroxide ("hot TMY") or tetramethyl ammonium hydroxide (TMAH), and the second sacrificial material layers 142B can include a second semiconductor material providing a second etch rate in the isotropic etchant. In an illustrative example, the first sacrificial material layers 142A may comprise a silicon-germanium alloy, and the second sacrificial material layers 142B may comprise amorphous silicon or another silicon-germanium alloy having a lower atomic concentration of germanium.

The thicknesses of each insulating layers 32L can be in a range from 20 nm to 50 nm, although lesser and greater thicknesses can be also be employed. The thickness of each of the first sacrificial material layers 142A and the second sacrificial material layers 142B can be in a range from 8 nm to 30 nm, such as from 10 nm to 20 nm, although lesser and greater thicknesses may also be employed. The number of repetitions of the unit layer stack (32, 142A, 142B) with the vertical repetition can be in a range from 2 to 1,024, and typically from 8 to 256, although a greater number of repetitions can also be employed. In one embodiment, each layer within the vertical repetition can have a uniform thickness that is substantially invariant within lateral translation.

Referring to FIGS. 4A-4D, a lithographic material stack (not shown) including at least a photoresist layer can be formed over the vertical repetition (32L, 142A, 142B), and can be lithographically patterned to form openings therein. In one embodiment, the openings may include a rectangular array of rectangular openings. Each opening may have a pair of sides laterally extending along the first horizontal direction hd1 and a pair of openings laterally extending along the second horizontal direction hd2. The pattern in the lithographic material stack can be transferred through the vertical repetition (32L, 142A, 142B) by at least one anisotropic etch that employs the patterned lithographic material stack as an etch mask. Portions of the vertical repetition (32L, 142A, 142B) underlying the openings in the patterned lithographic material stack are etched to form memory openings 49. As used herein, a "memory opening" refers to a structure in which a memory opening fill structure is subsequently formed. The memory openings 49 are formed through the vertical repetition (32L, 142A, 142B). Optionally, a back gate electrode may be formed in the upper portion of the first via-level dielectric layer 16 at locations underlying the memory openings 49.

The memory openings 49 extend through the entirety of the vertical repetition (32L, 142A, 142B). The chemistry of the anisotropic etch process employed to etch through the materials of the vertical repetition (32L, 142A, 142B) can cycle through multiple repetitions of at least two etch chemistries to optimize etching of the unmasked portions of the vertical repetition (32L, 142A, 142B). The anisotropic etch can be, for example, a series of reactive ion etches. The sidewalls of the memory openings 49 and the support openings can be substantially vertical, or can be tapered. In one embodiment, bottom surfaces of the memory openings 49 and the support openings can be formed on, or within, the first via-level dielectric layer 16. The patterned lithographic material stack can be subsequently removed, for example, by ashing.

Figures 5A, 5B:
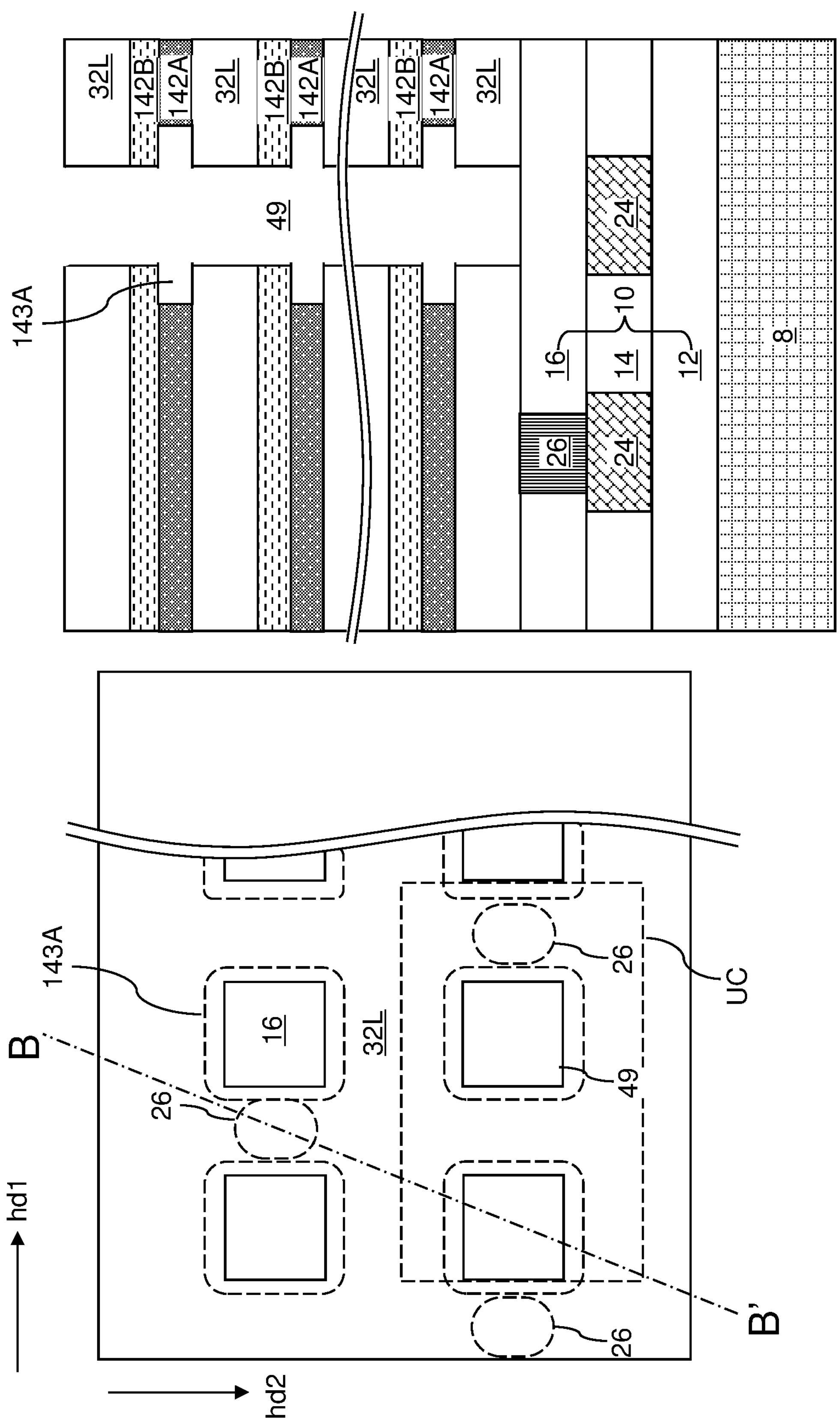
FIGS. 5A and 5B are various views of the exemplary structure after formation of first lateral recesses according to an embodiment of the present disclosure.

Referring to FIGS. 5A and 5B, first lateral recesses 143A can be formed by performing an isotropic etch process that etches the materials of the first sacrificial material layers 142A selective to the materials of the insulating layers 32 and the second sacrificial material layers 142B. For example, if the insulating layers 32 comprise undoped silicate glass or a doped silicate glass, and if the first sacrificial material layers 142A comprise a first silicon nitride material having a higher etch rate in dilute HF than a second silicon nitride material of the second sacrificial material layers 142B, the isotropic etch process can include dilute HF. If the insulating layers 32 comprise undoped silicate glass or a doped silicate glass, if the first sacrificial material layers 142A comprise a silicon-germanium alloy, and the second sacrificial material layers 142B comprise amorphous silicon, the isotropic etch process can include a wet etch process employing a mixture of dilute hydrofluoric acid and hydrogen peroxide.

Generally, the first lateral recesses 143A can be formed by laterally recessing each of the first sacrificial material layers 142A around each of the memory openings 49. The lateral recess distance for the first lateral recesses 143A can be in a range from 5 nm to 50 nm, although lesser and greater lateral recess distances may also be employed. Each first lateral recess 143A may have a generally toroidal shape, and may comprise a pair of straight sidewalls laterally extending along the first horizontal direction hd1, a pair of straight sidewalls laterally extending along the second horizontal direction hd2, and four contoured sidewalls having vertically-straight and horizontally-concave sidewalls.

Figures 6A, 6B:
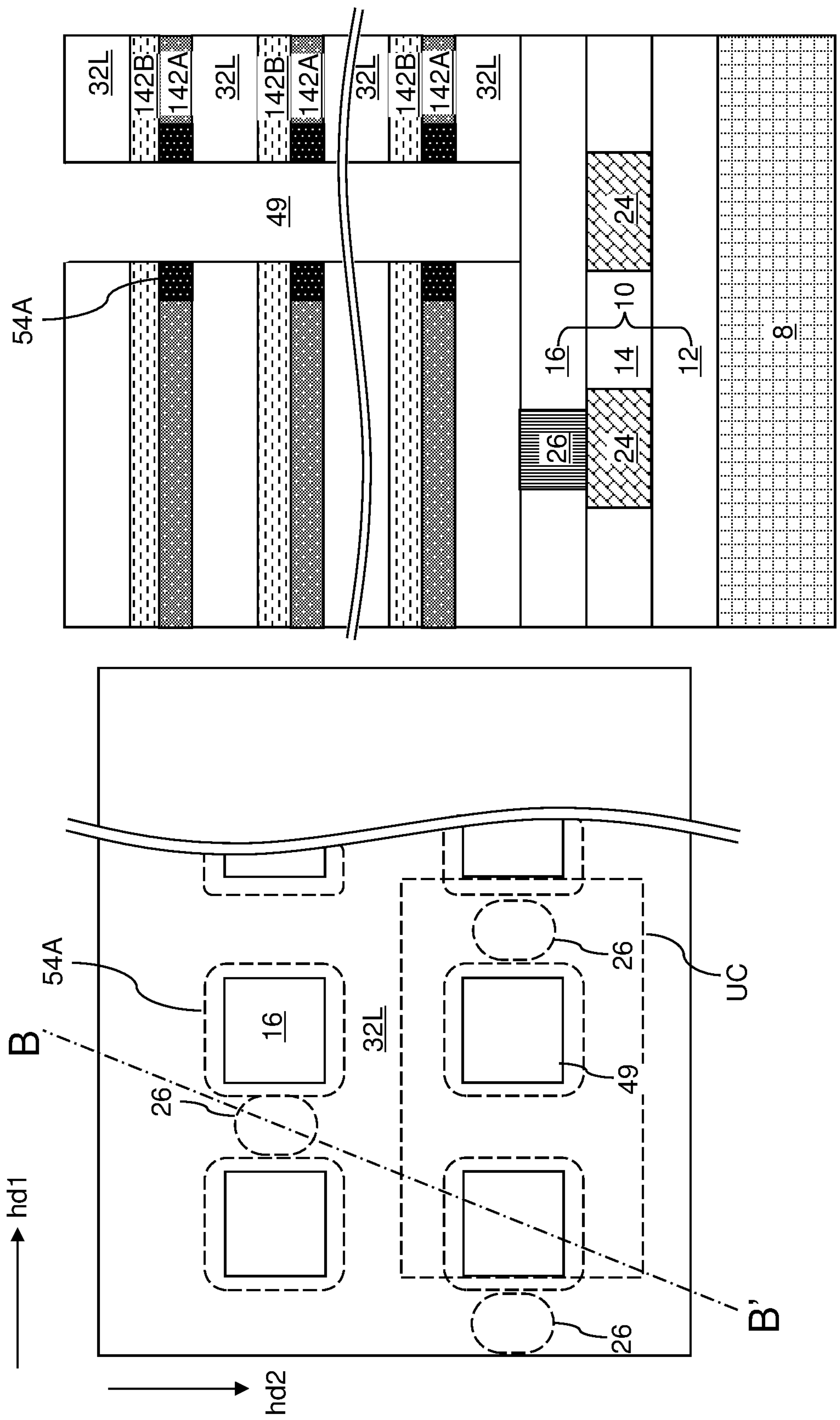
FIGS. 6A and 6B are various views of the exemplary structure after formation of first memory material portions according to an embodiment of the present disclosure.

Referring to FIGS. 6A and 6B, a first memory material layer including a first memory material can be conformally deposited to fill the first lateral recesses 143A. The first memory material may include, or may consist essentially of, an electrically conductive material such as metal, heavily doped polysilicon, or electrically conductive metal alloy that can function as a floating gate material. The thickness of the first memory material layer can be selected such that the entire volume of each of the first lateral recesses 143A is filled with the first memory material. An anisotropic etch process can be performed to remove portions of the first memory material layer from outside the volumes of the first lateral recesses 143A. Each remaining contiguous portion of the first memory material layer in the first lateral recesses comprises a first memory material portion 54A.

Figure 7B:
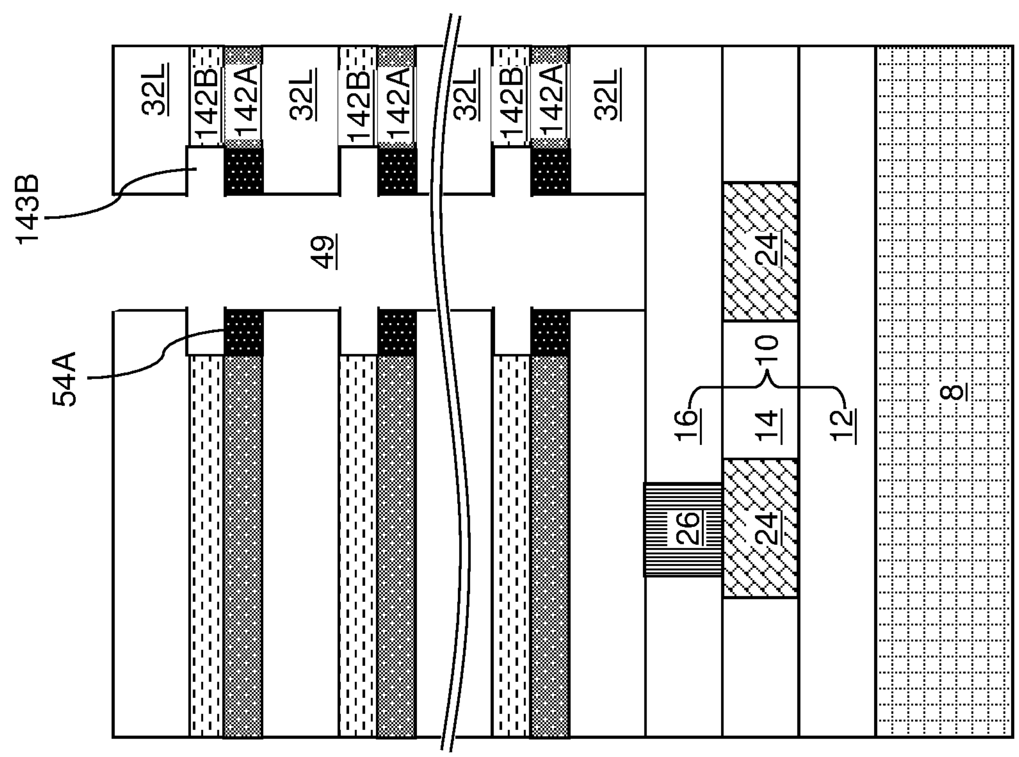
FIGS. 7A and 7B are various views of the exemplary structure after formation of second lateral recesses according to an embodiment of the present disclosure.
Figure 7A:
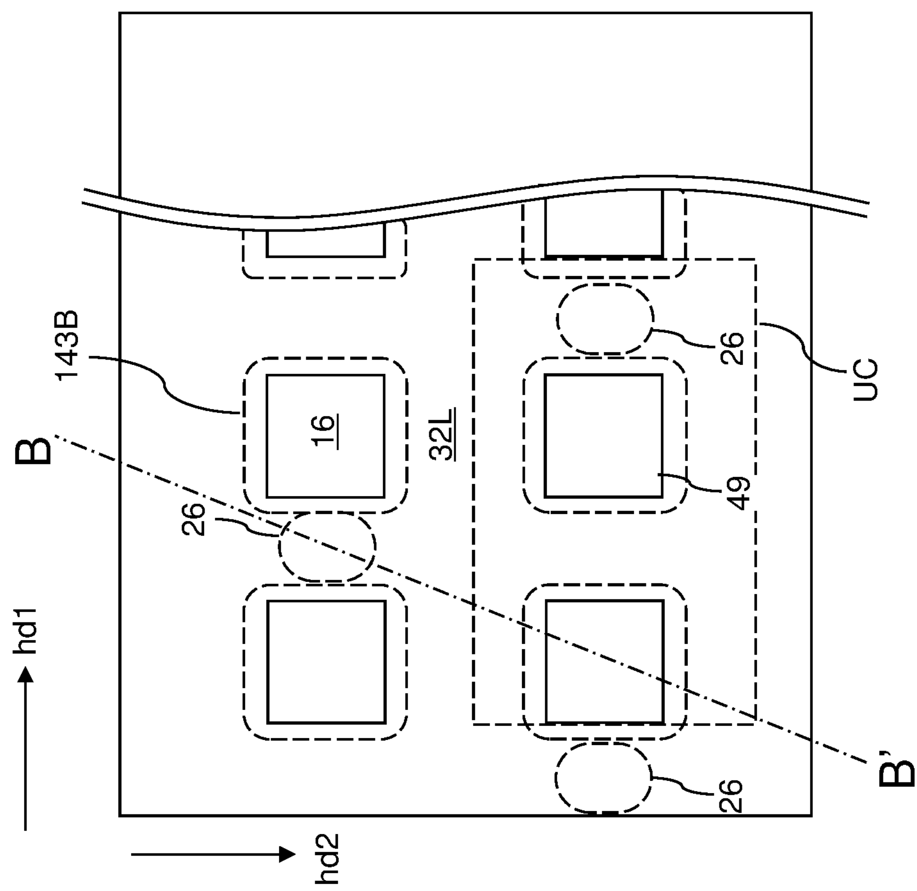

Referring to FIGS. 7A and 7B, second lateral recesses 143B can be formed by performing an isotropic etch process that etches the materials of the second sacrificial material layers 142B selective to the materials of the insulating layers 32 and the first memory material portions 54A. For example, if the insulating layers 32 comprise undoped silicate glass or a doped silicate glass, and if the second sacrificial material layers 142B comprise a second silicon nitride material, the isotropic etch process can include a wet etch process employing hot phosphoric acid. If the insulating layers 32 comprise undoped silicate glass or a doped silicate glass, and if the second sacrificial material layers 142B comprise a silicon-germanium alloy or amorphous silicon, the isotropic etch process can include a wet etch process employing a mixture of dilute hydrofluoric acid and hydrogen peroxide.

Generally, the second lateral recesses 143B can be formed by laterally recessing each of the second sacrificial material layers 142B around each of the memory openings 49. The lateral recess distance for the second lateral recesses 143B can be in a range from 5 nm to 50 nm, although lesser and greater lateral recess distances may also be employed. Each second lateral recess 143B may have a generally toroidal shape, and may comprise a pair of straight sidewalls laterally extending along the second horizontal direction hd1, a pair of straight sidewalls laterally extending along the second horizontal direction hd2, and four contoured sidewalls having vertically-straight and horizontally-concave sidewalls.

Figure 8B:
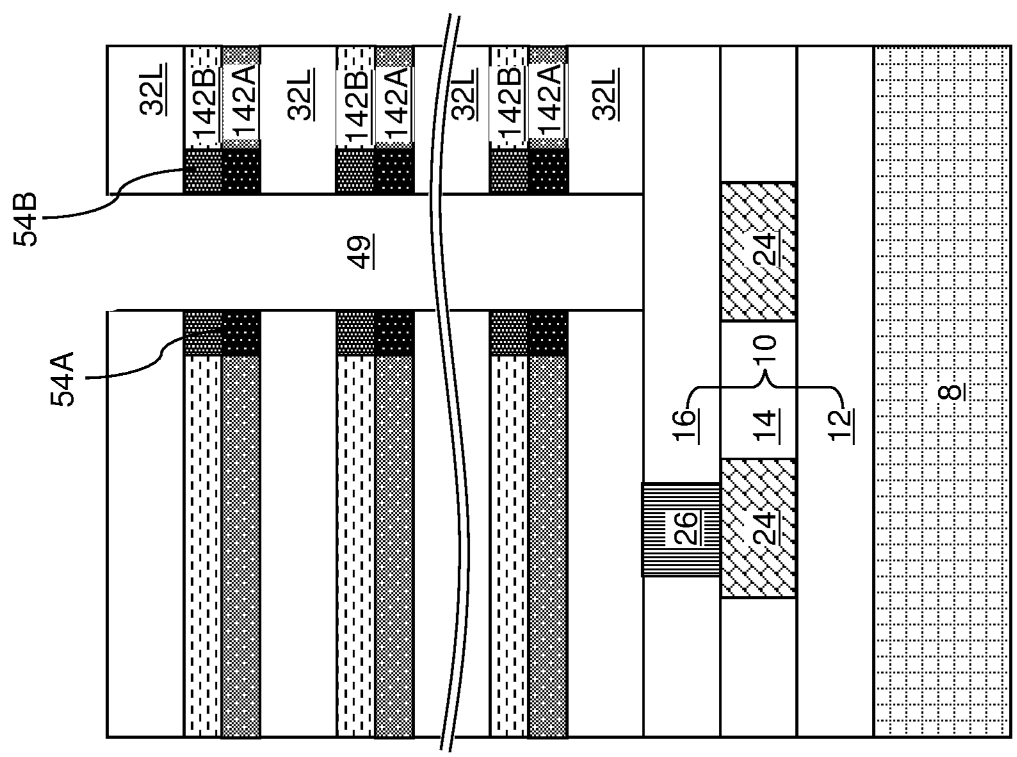
FIGS. 8A and 8B are various views of the exemplary structure after formation of second memory material portions according to an embodiment of the present disclosure.
Figure 8A:
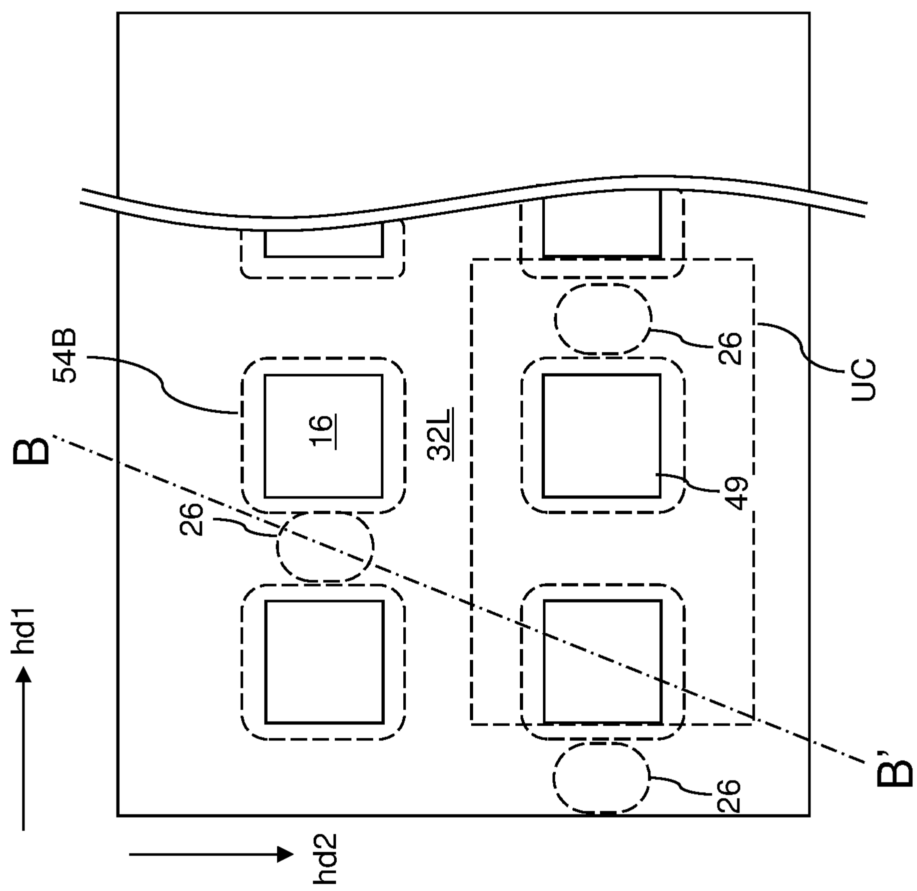

Referring to FIGS. 8A and 8B, a second memory material layer including a second memory material can be conformally deposited to fill the second lateral recesses 143B. The second memory material is different from the first memory material. The second memory material may include, or may consist essentially of, an electrically conductive material such as a metal, heavily doped polysilicon or an electrically conductive metal alloy that can function as a floating gate material. The thickness of the second memory material layer can be selected such that the entire volume of each of the second lateral recesses 143B is filled with the second memory material. An anisotropic etch process can be performed to remove portions of the second memory material layer from outside the volumes of the second lateral recesses 143B. Each remaining contiguous portion of the second memory material layer in the second lateral recesses comprises a second memory material portion 54B.

In one embodiment, the first memory material portion 54A comprises a first floating gate having a first work function and the second memory material portion 54B comprises a second floating gate having a second work function different from the first work function by at least 0.5 eV, such as 0.5 eV to 2.5 eV, such as 0.75 eV to 1.5 eV. For example, the first floating gate 54A may comprise a first metal or conductive metal alloy (e.g., metal silicide or metal nitride), and the second floating gate 54 may comprise a second metal or metal alloy having a different composition from the first metal alloy. For example, the first floating gate 54A may comprise one of titanium, platinum, ruthenium, titanium nitride, hafnium nitride, tantalum nitride, zirconium nitride, titanium silicide, nickel silicide, or cobalt silicide, while the second floating gate 54A may comprise another one of titanium, platinum, ruthenium, titanium nitride, hafnium nitride, tantalum nitride, zirconium nitride, titanium silicide, nickel silicide, or cobalt silicide.

In the embodiment shown in FIG. 8B, the first floating gate 54A contacts the second floating gate 54B. In an alternative embodiment, the first floating gate 54A is separated from the second floating gate 54B by an insulating memory isolation liner, as will be described in more detail below with respect to FIGS. 18A-18D.

A contiguous set of a first memory material portion 54A and a second memory material portion 54B constitutes a memory element (54A, 54B). A vertical stack of memory elements (54A, 54B) is formed around each memory opening 49. Each of the memory elements (54A, 54B) is located between a vertically neighboring pair of insulating layers 32L within the vertical repetition (32L, 142A, 142B). Each of the memory elements (54A, 54B) comprises at least one horizontal surface contacting a horizontal surface of the vertically neighboring pair of insulating layers 32L within the vertical repetition (32L, 142A, 142B). In one embodiment, each of the memory elements (54A, 54B) comprises: a first horizontal surface contacting a horizontal bottom surface of an overlying insulating layer 32L and a second horizontal surface contacting a horizontal top surface of an underlying insulating layer 32L. Each memory element (54A, 54B) within a respective vertical stack of memory elements (54A, 54B) around a memory opening 49 can be vertically spaced apart from each other by the insulting layers 32L.

Figure 9B:
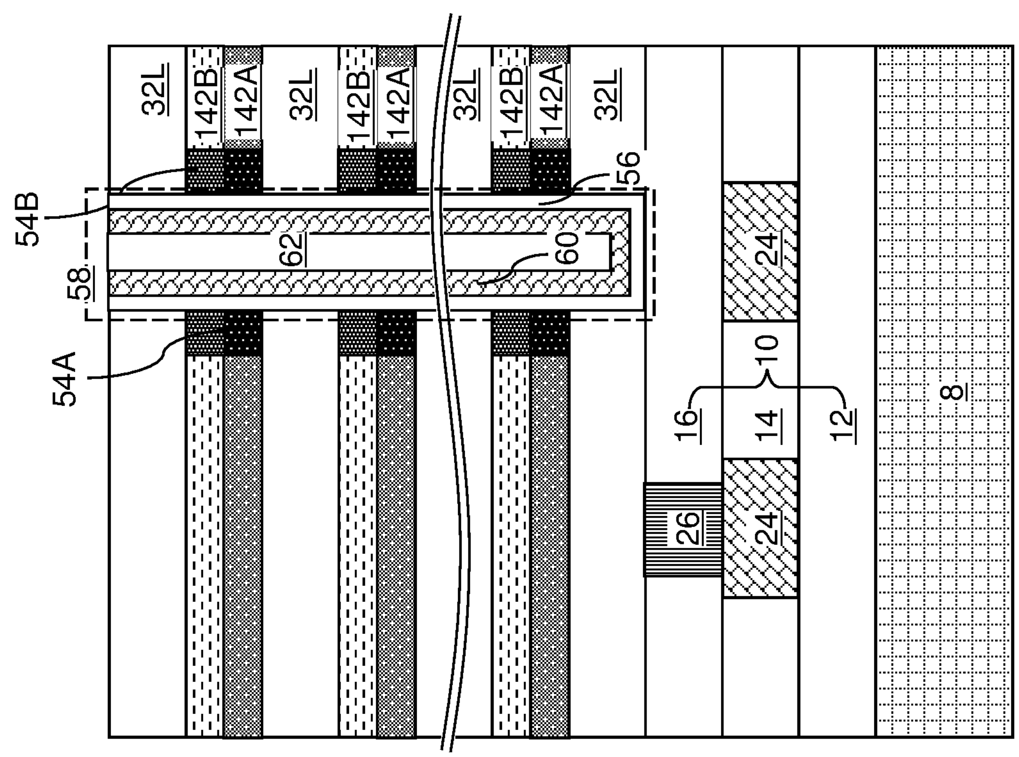
FIGS. 9A and 9B are various views of the exemplary structure after formation of memory opening fill structures according to an embodiment of the present disclosure.
Figure 9A:
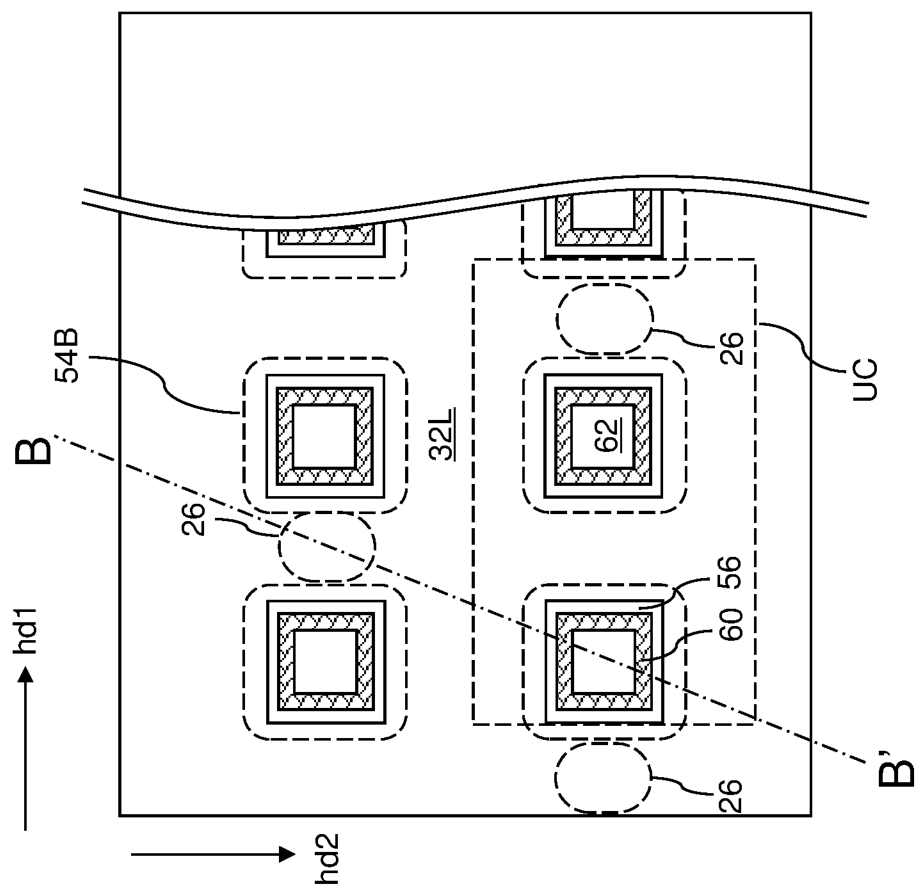
Figure 10B:
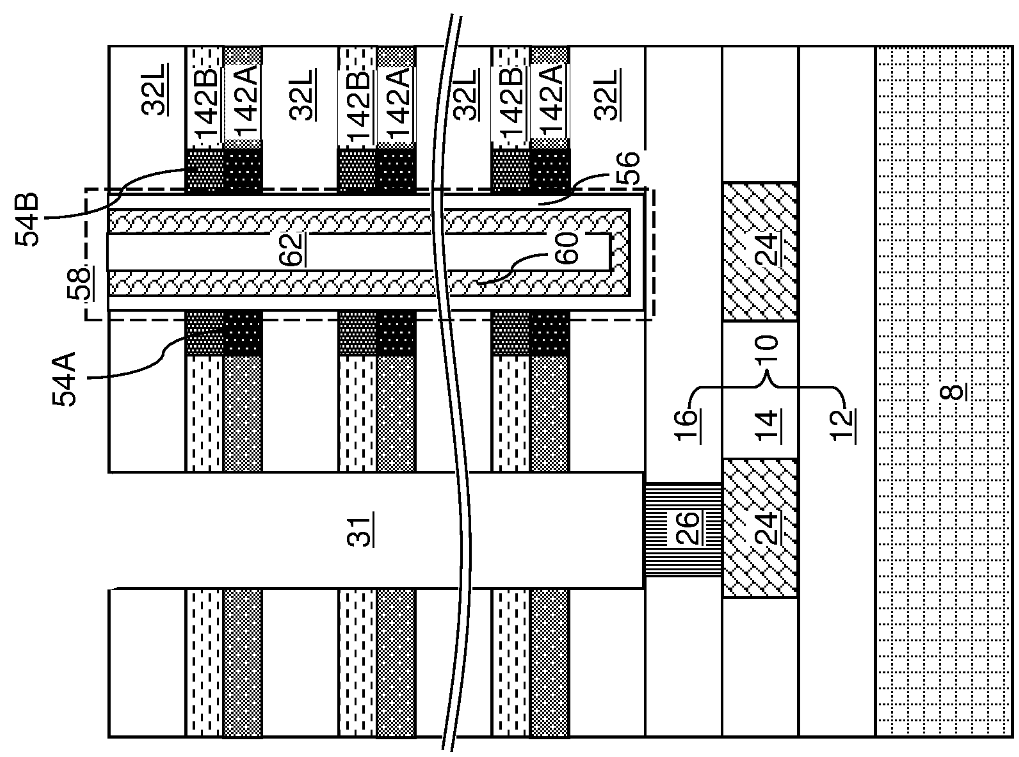
FIGS. 10A-10D are various views of the exemplary structure after formation of pillar cavities according to an embodiment of the present disclosure.
Figure 10A:
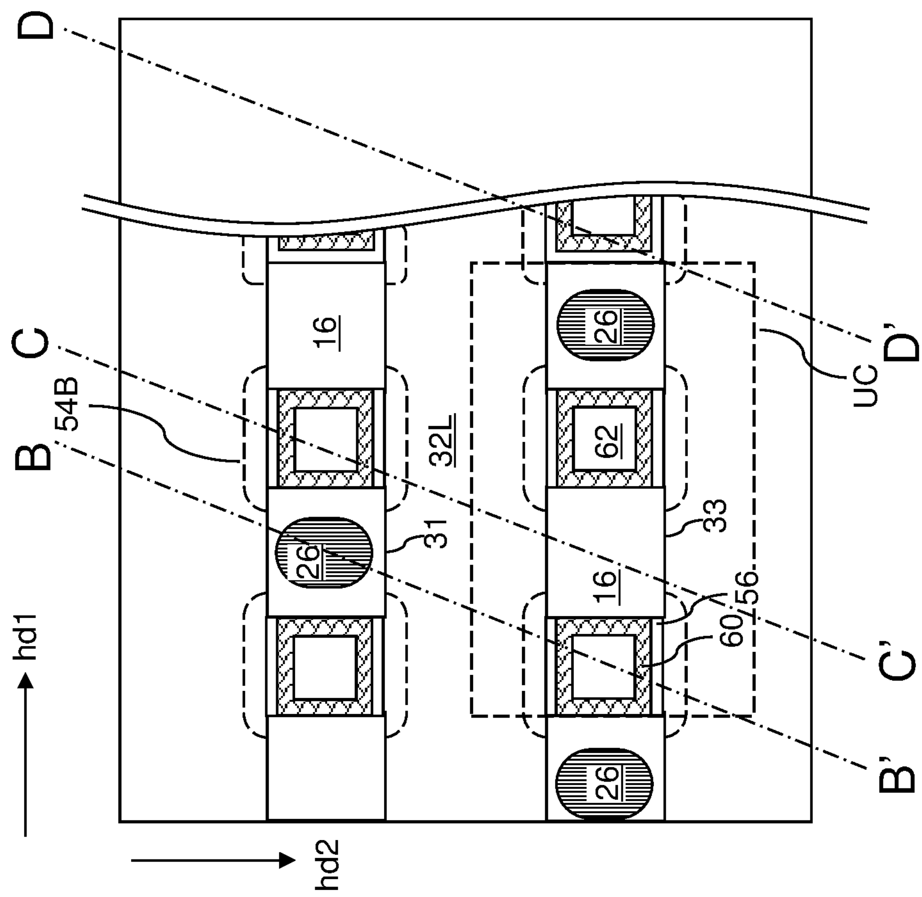
Figure 10C:
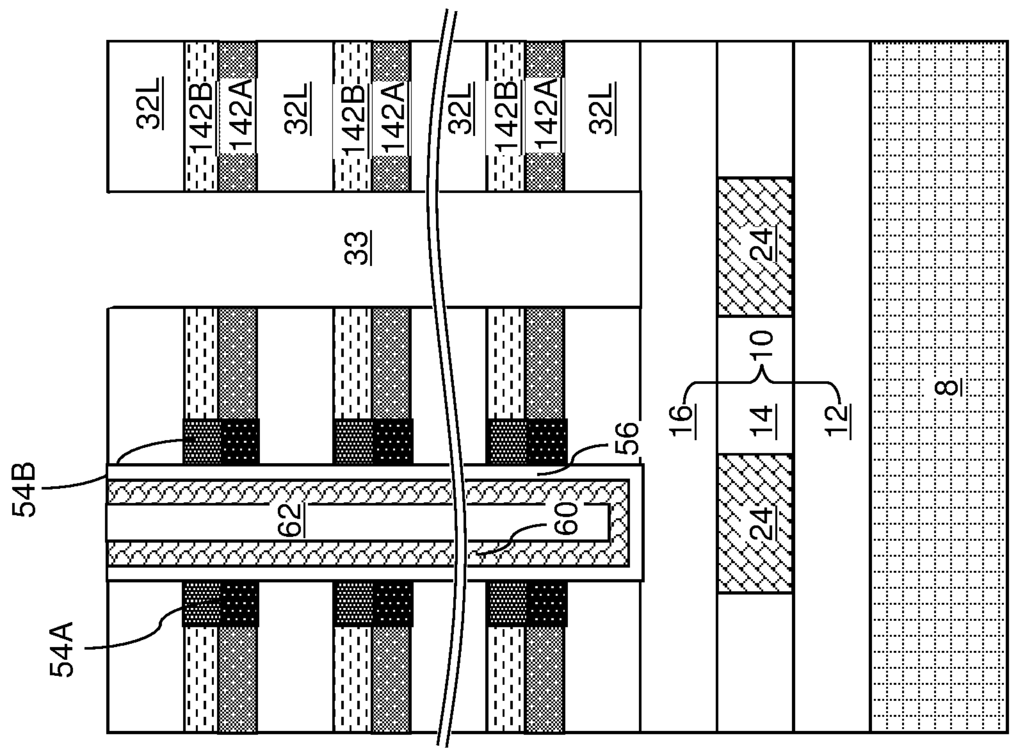
Figure 10D:
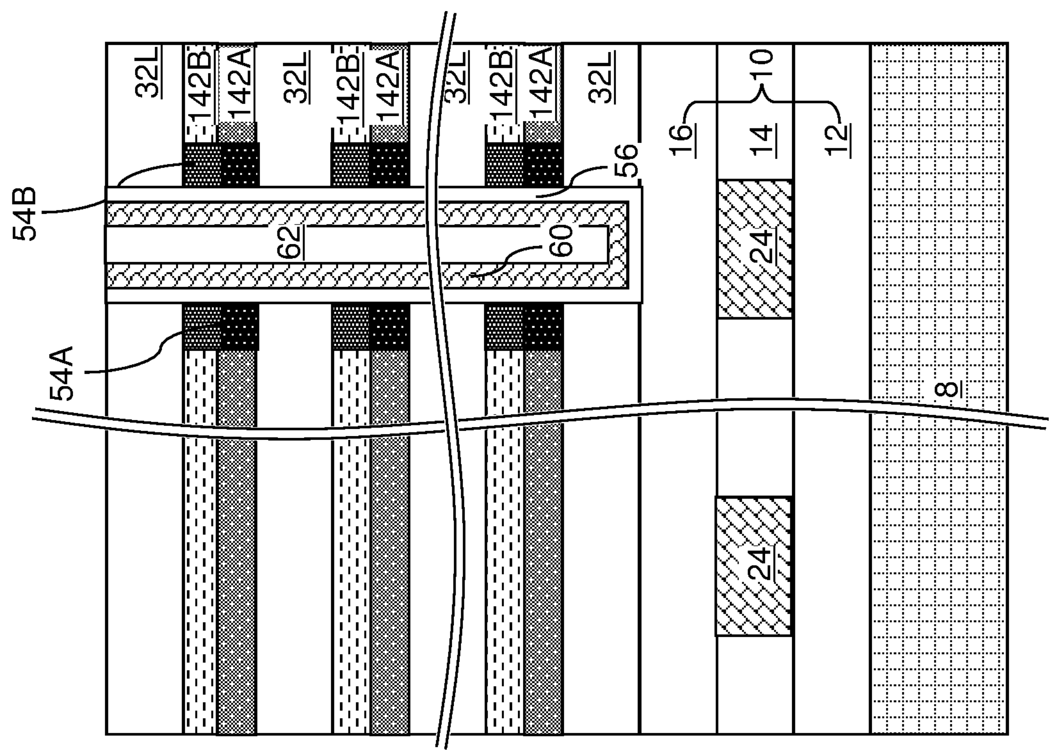
Figure 11B:
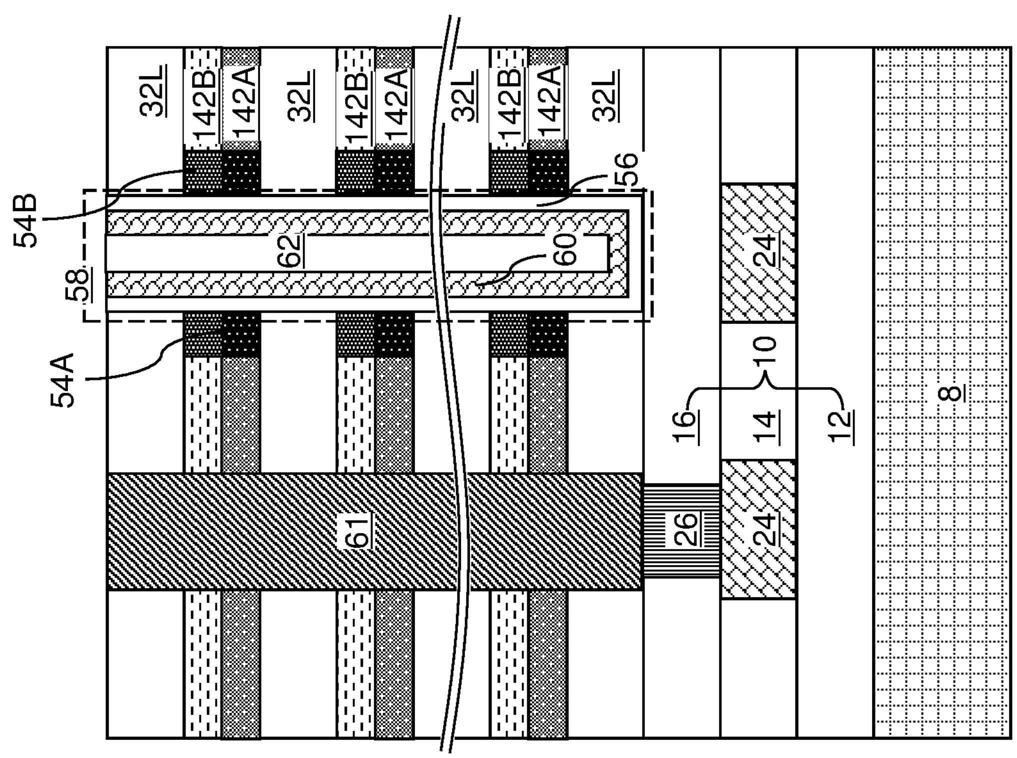
FIGS. 11A-11D are various views of the exemplary structure after formation of source pillar structures and drain pillar structures according to an embodiment of the present disclosure.
Figure 11A:
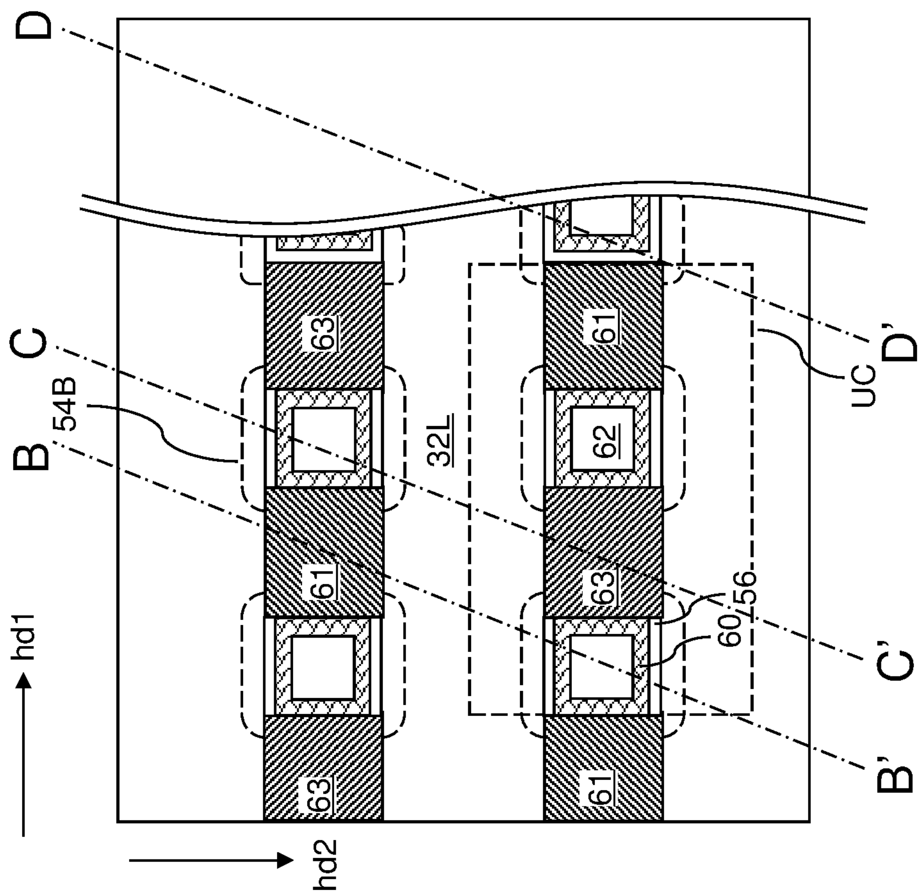
Figure 11C:
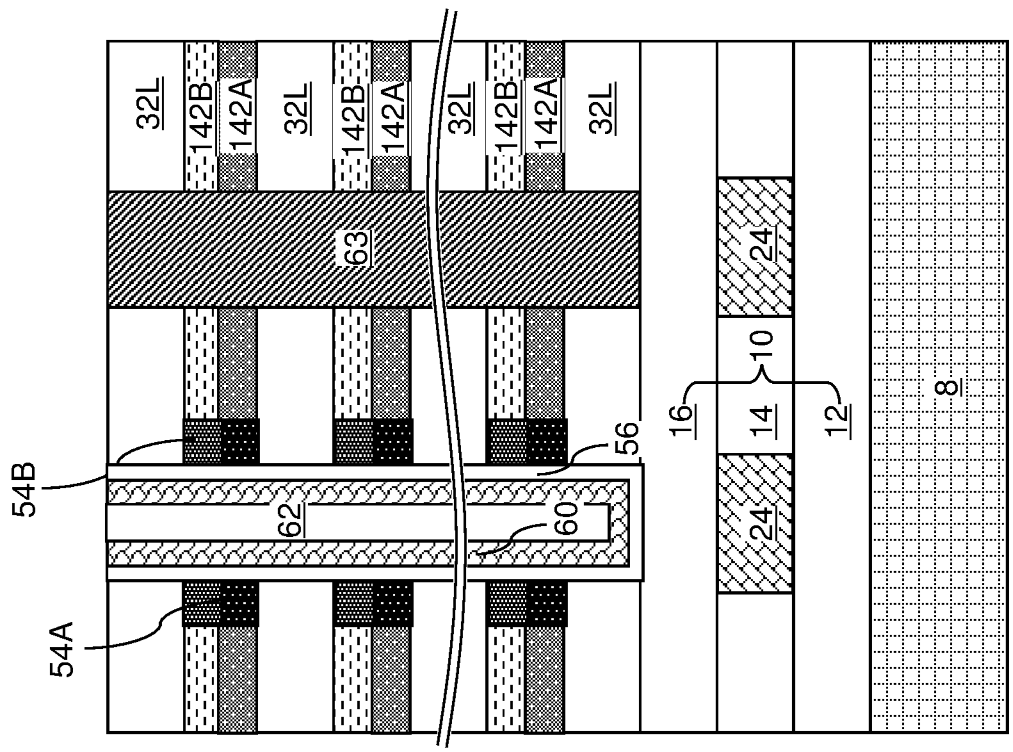
Figure 11D:
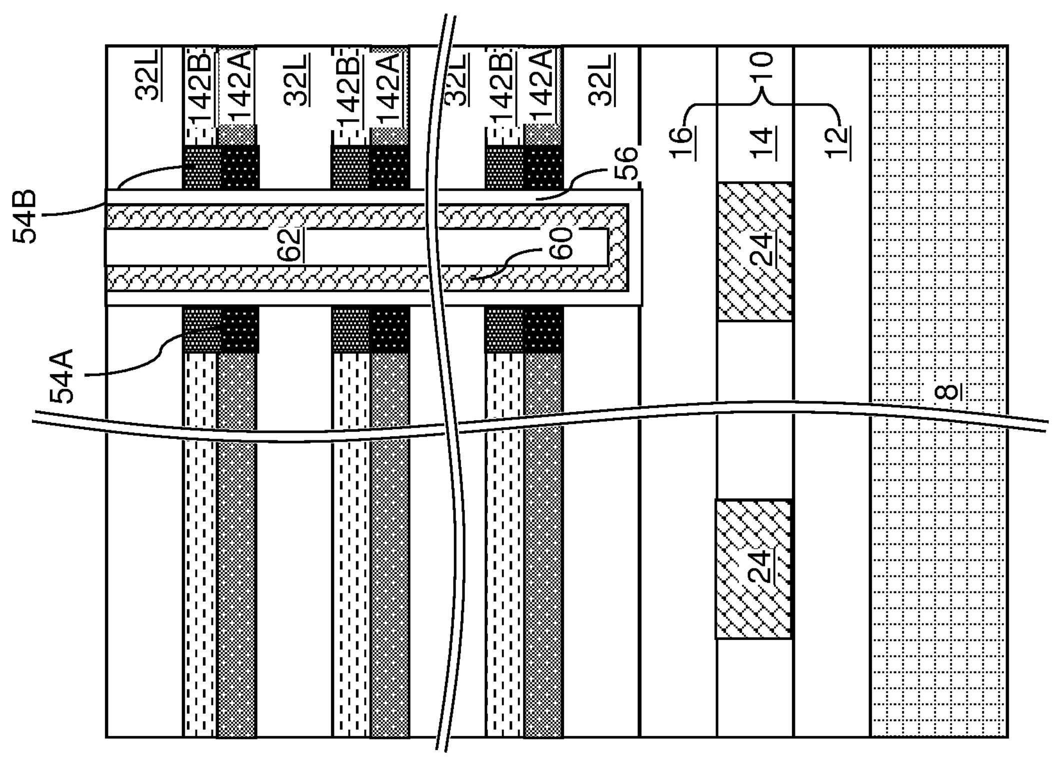

Referring to FIGS. 9A and 9B, a memory opening fill structure 58 may be formed within each memory opening 49. In one embodiment, each memory opening fill structure 58 includes a dielectric liner 56, a semiconductor channel 60, and a dielectric core 62. In an illustrative example, a layer stack including a continuous dielectric liner, a continuous semiconductor channel material layer, and a dielectric fill material layer can be sequentially deposited in the memory openings 49, and excess portions of the layer stack overlying the topmost surface of the vertical repetition (32L, 142A, 142B) can be removed by performing a planarization process such as a chemical mechanical polishing process. Each remaining portion of the continuous dielectric liner comprises a dielectric liner 56. Each remaining portion of the continuous semiconductor channel material layer comprises a semiconductor channel 60. Each remaining portion of the dielectric fill material layer comprises a dielectric core 62. Top surfaces of the dielectric liners 56, the semiconductor channels 60, and the dielectric cores 62 may be located within a same horizontal plane. Optionally, a back gate electrode may be formed under the bottom (i.e., horizontal) portion of the vertical semiconductor channel 60, as described above.

In one embodiment, each the first memory material portions 54A and the second memory material portions 54B may comprise a charge storage material (such as a floating gate material), and the dielectric liner 56 may comprise a tunneling dielectric layer through which charge tunneling can be performed under suitable electrical bias conditions. The charge tunneling may be performed through hot-carrier injection or by Fowler-Nordheim tunneling induced charge transfer depending on the mode of operation of a NAND string or a NOR string to be subsequently formed. The dielectric liner 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the dielectric liner 56 can include a stack of a first silicon oxide layer, a silicon oxynitride layer, and a second silicon oxide layer, which is commonly known as an ONO stack. In one embodiment, the dielectric liner 56 can include a silicon oxide layer that is substantially free of carbon or a silicon oxynitride layer that is substantially free of carbon. The thickness of the dielectric liner 56 can be in a range from 2 nm to 20 nm, although lesser and greater thicknesses can also be employed.

The semiconductor channels 60 include a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channels 60 include amorphous silicon or polysilicon. The semiconductor channels 60 may have a first conductivity type doping, which may be p-type doping or n-type doping. The atomic concentration of dopants of the first conductivity type in the semiconductor channels 60 can be in a range from $1.0\times10^{14}/cm^3$ to $3.0\times10^{18}/cm^3$, although lesser and greater dopant concentrations can also be employed. The thickness of the semiconductor channels 60 can be in a range from 2 nm to 10 nm, although lesser and greater thicknesses can also be employed.

The dielectric cores 62 include a dielectric fill material such as undoped silicate glass or a doped silicate glass. Each dielectric core 62 can be laterally surrounded by a respective semiconductor channel 60, which can be laterally surrounded by a respective dielectric liner 56.

Generally, a memory film (56, 54A, 54B) can be located between each semiconductor channel 60 and the vertical repetition (32L, 142A, 142B). Each memory film (56, 54A, 54B) comprises a respective dielectric liner 56 and a respective vertical stack of memory elements (54A, 54B). Each of the memory elements (54A, 54B) comprises a first memory material portion 54A having a first memory material composition and a second memory material portion 54B having a second memory material composition that is different from the first memory material composition.

In one embodiment, the first memory material portion 54A and the second memory material portion 54B within each of the memory elements (54A, 54B) is in contact with a respective one of the dielectric liners 56, and overlies or underlies each other. Each memory element (54A, 54B) within the respective vertical stack of memory elements (54A, 54B) is vertically spaced apart from each other, and contacts a respective surface segment of the respective dielectric liner 56. A semiconductor channel 60 is formed over a respective vertical stack of memory elements (54A, 54B) in each memory opening 49. A combination of the semiconductor channel 60 and the memory film (56, 54A, 54B) comprises a memory opening fill structure 58.

Referring to FIGS. 10A-10D, a photoresist layer (not shown) can be applied over a topmost surface of the vertical repetition (32L, 142A, 142B). The photoresist layer can be lithographically patterned to form a two-dimensional array of openings. According to an aspect of the present disclosure, the two-dimensional array of openings in the photoresist layer can be interlaced with the two-dimensional array of memory opening fill structures 58. In one embodiment, the two-dimensional array of opening in the photoresist layer may comprise a two-dimensional array of rectangular openings.

An anisotropic etch process may be performed to etch unmasked portions of the vertical repetition (32L, 142A, 142B). Pillar cavities (31, 33) can be formed through the vertical repetition (32L, 142A, 142B) within areas of the openings in the photoresist layer. In one embodiment, the pillar cavities (31, 33) can include source pillar cavities 31 exposing a top surface of a first connection via structure 26, and drain pillar cavities 33 located between neighboring pairs of first connection via structures 26. The entirety of the bottom surface of each drain pillar cavity 33 can be a dielectric surface of layer 16.

In one embodiment, portions of the memory films (56, 54A, 54B) that laterally extend along the second horizontal direction hd2 on sidewalls of the semiconductor channels 60 can be removed during the anisotropic etch process that forms the pillar cavities (31, 33). Each memory element (54A, 54B) having a toroidal configuration prior to the anisotropic etch process is divided into a pair of memory elements (54A, 54B) that extend along the first horizontal direction and that are laterally spaced apart along the second horizontal direction hd2 by the respective memory opening fill structure 58. Adjacent memory elements (54A, 54B) are laterally spaced apart along the first horizontal direction hd1 by a source pillar cavity 31 or drain pillar cavity 33. Thus, sidewalls of each semiconductor channel 60 can be physically exposed to a respective one of the source pillar cavities 31 and one of the drain pillar cavities 33. The physically exposed sidewalls of the semiconductor channels 60 laterally extend along the second horizontal direction hd2. In one embodiment, each of the source pillar cavities 31 and the drain pillar cavities 33 may have a respective rectangular horizontal cross-sectional shape.

Referring to FIGS. 11A-11D, a doped semiconductor is deposited within of the pillar cavities (31, 33). The deposited semiconductor material can have a doping of a second conductivity type that is the opposite of the first conductivity type. For example, if the first conductivity type is p-type, then the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material can be removed from above the horizontal plane including the top surface of the vertical repetition (32L, 142A, 142B), for example, by chemical mechanical planarization (CMP) or a recess etch process. Each remaining portion of the doped semiconductor material having a doping of the second conductivity type constitutes within a source pillar cavity 31 constitutes a source pillar structure 61. Each remaining portion of the doped semiconductor material having a doping of the second conductivity type constitutes within a drain pillar cavity 33 constitutes a drain pillar structure 63. Each source pillar structure 61 can be formed on a top surface of a respective one of the first connection via structures 26, which may be source connection via structures.

The source pillar structures 61 and the drain pillar structures 63 are formed through the vertical repetition (32L, 142A, 412B). Each of the semiconductor channels 60 contacts a respective source pillar structure 61 and a respective drain pillar structure 63. Each contiguous combination of a source pillar structure 61, a semiconductor channel 60 (which is referred to as a first semiconductor channel), a drain pillar structure 63, and another semiconductor channel 60 (which is referred to as a second semiconductor channel) constitutes a transistor active region assembly. As used herein, transistor active region refers to a semiconductor region of a field effect transistor, which may be a source region, a drain region, or semiconductor channel. Laterally-alternating sequences of transistor active region assemblies (61, 60, 63) can be located between neighboring pairs of laterally-extending portions of the vertical repetition (32L, 142A, 142B). Generally, each of the transistor active region assemblies (61, 60, 63) comprises a source pillar structure 61, a first semiconductor channel 60, and a drain pillar structure 63, and may include a second semiconductor channel 60 that is in contact with the drain pillar structure 63.

In one embodiment, the source pillar structure 61 and the drain pillar structure 63 within each of the transistor active region assemblies (61, 60, 63) vertically extend at least from a first horizontal plane including bottommost surfaces of the vertical repetition (32L, 142A, 142B) to a second horizontal plane including topmost surfaces of the vertical repetition (32L, 142A, 142B). In one embodiment, the semiconductor channel 60 within each of the transistor active region assemblies (61, 60, 63) vertically extends at least from the first horizontal plane to the second horizontal plane.

Referring to FIGS. 12A-12D, a photoresist layer (not shown) can be applied over the vertical repetition (32L, 142A, 142B), and is lithographically patterned to form elongated openings adjacent to end regions of the transistor active region assemblies (61, 60, 63). The pattern in the photoresist layer can be transferred through the vertical repetition (32L, 142A, 142B) employing an anisotropic etch to form backside trenches 79, which vertically extend from the top surface of the vertical repetition (32L, 142A, 142B) at least to the top surface of the first via-level dielectric layer 16.

Figure 12B:
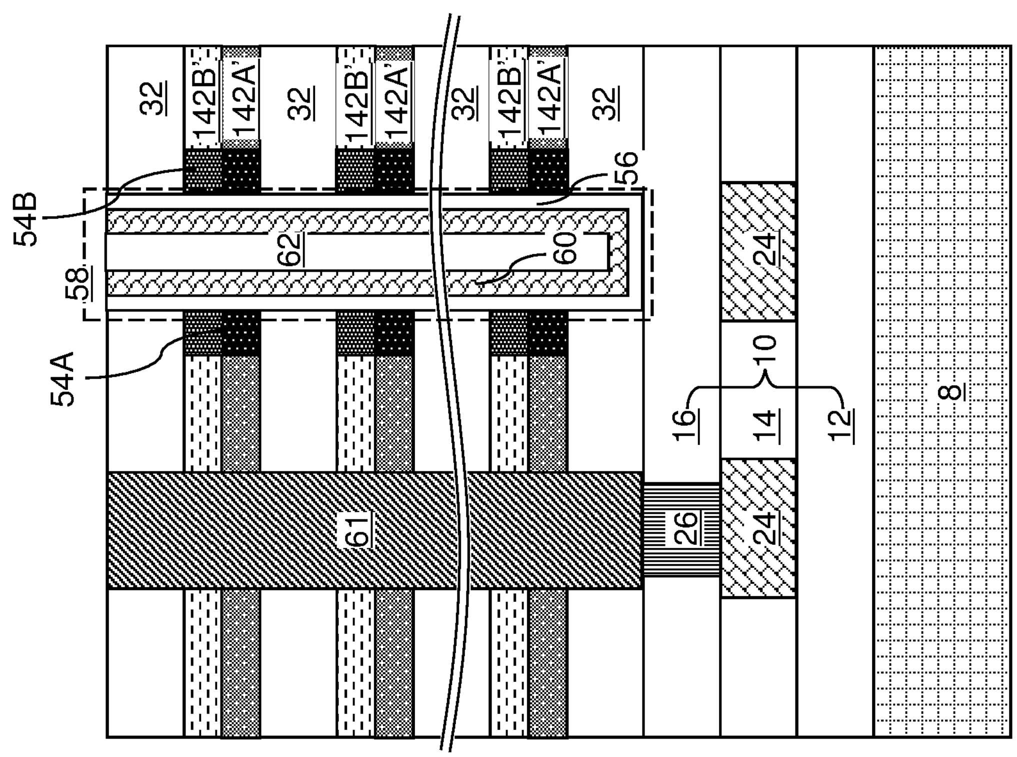
FIGS. 12A-12D are various views of the exemplary structure after formation of backside trenches according to an embodiment of the present disclosure.
Figure 12A:
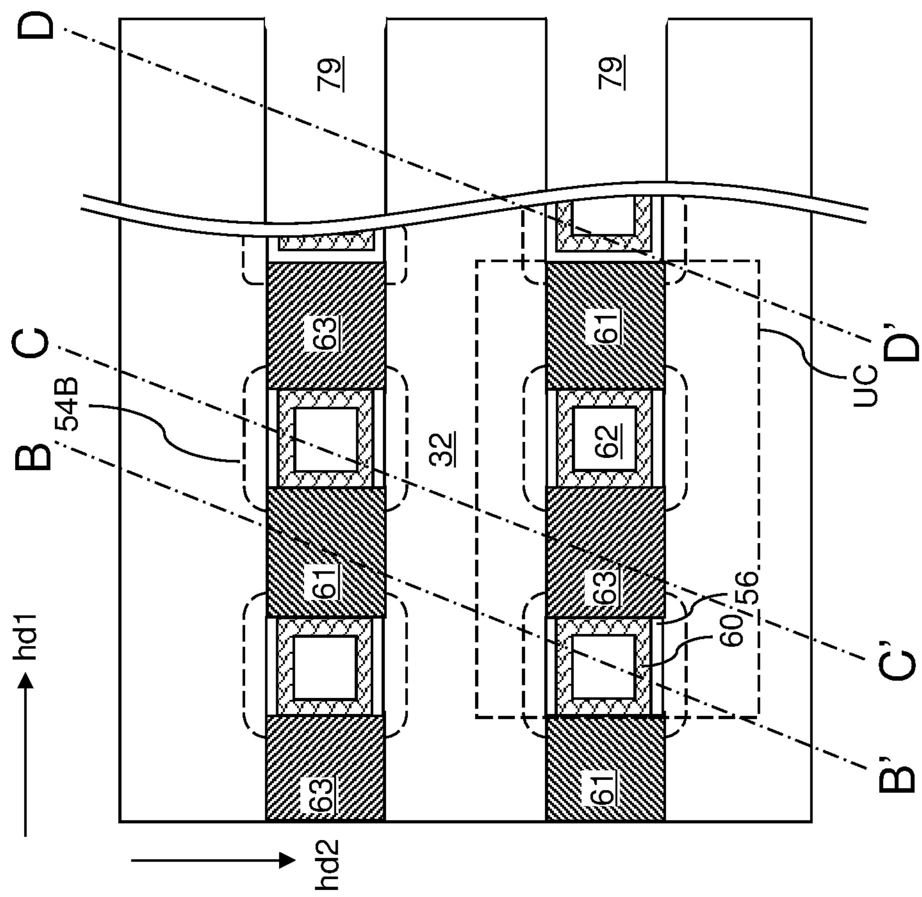
Figure 12C:
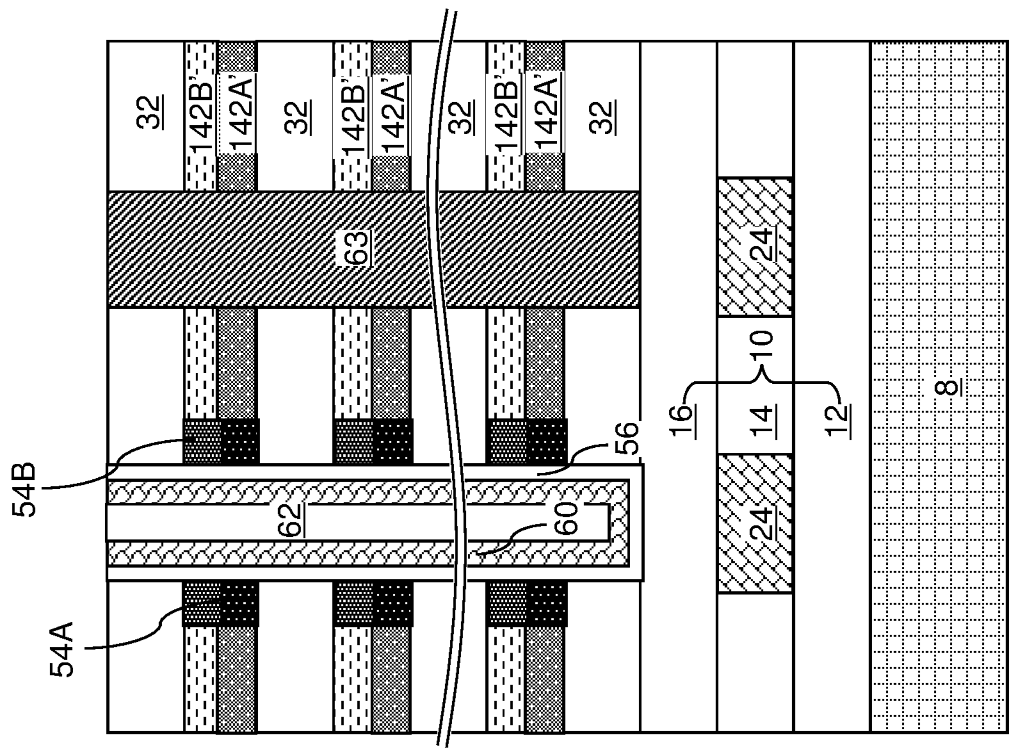
Figure 12D:
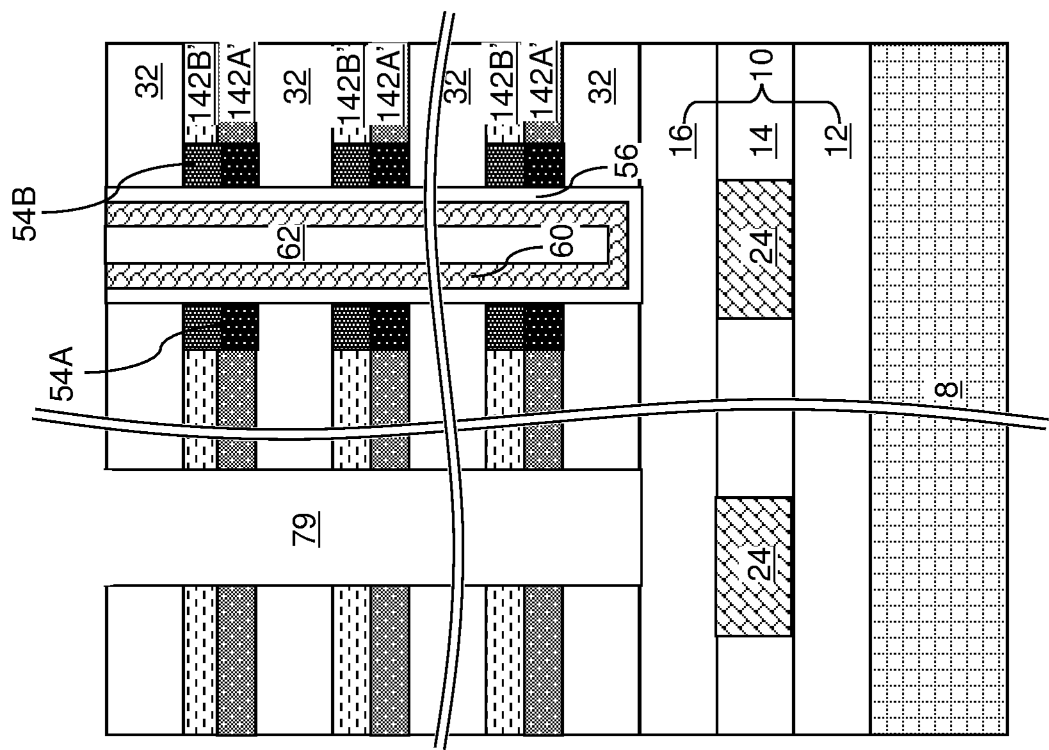
Figure 13B:
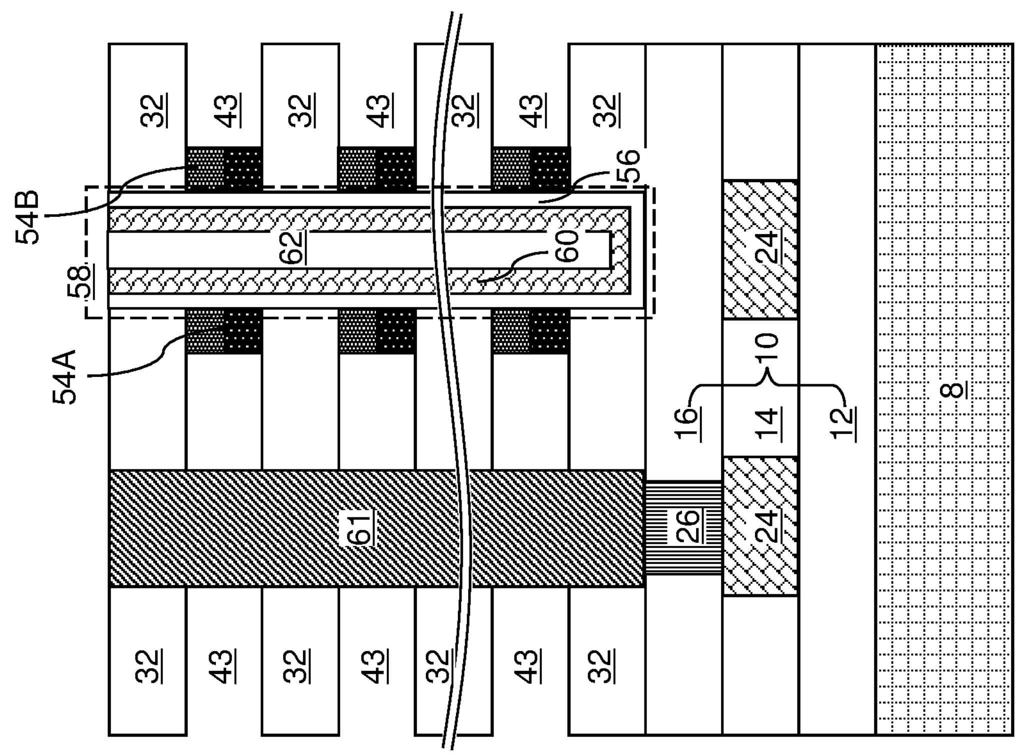
FIGS. 13A-13D are various views of the exemplary structure after formation of backside recesses according to an embodiment of the present disclosure.
Figure 13A:
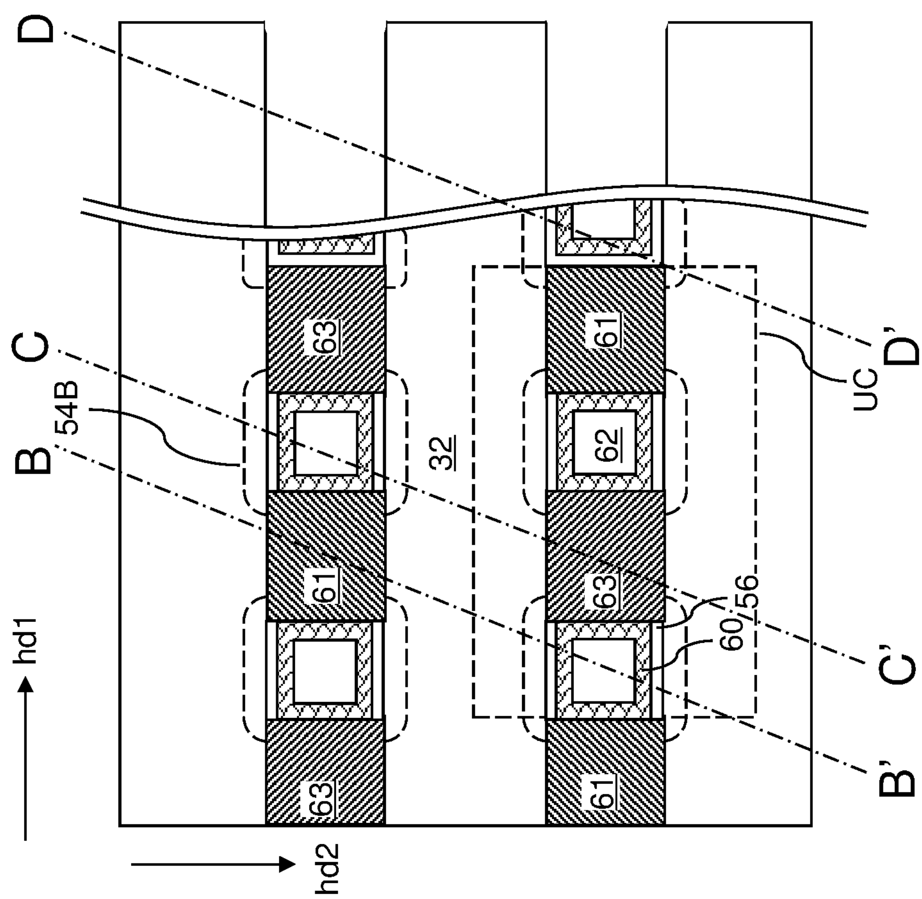
Figure 13C:
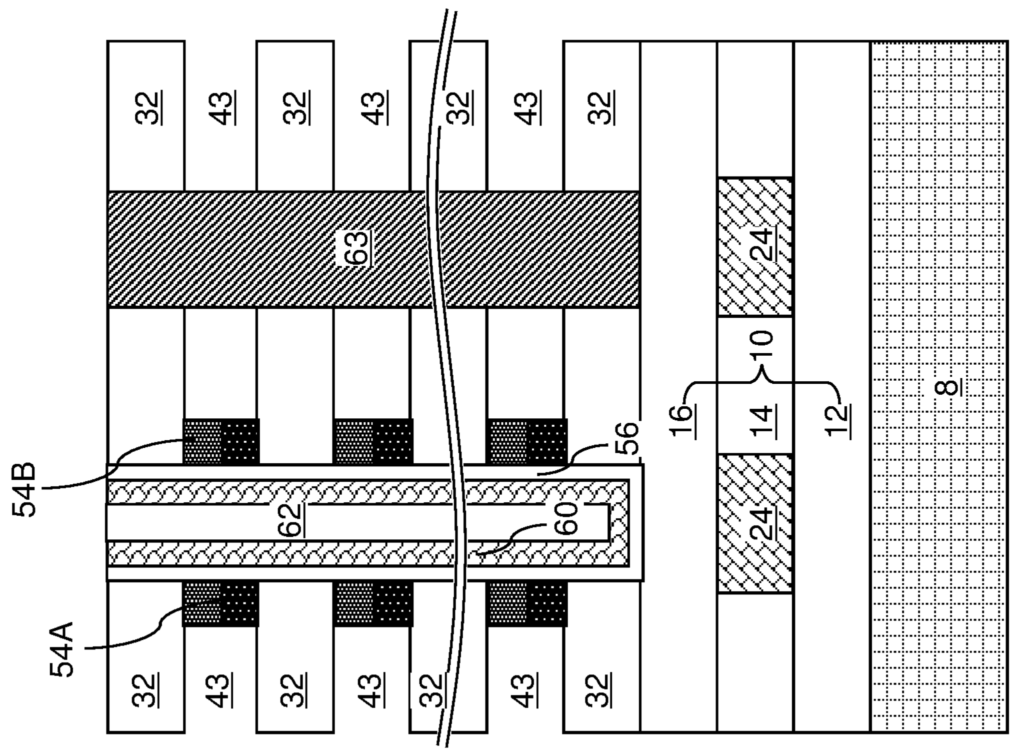
Figure 13D:
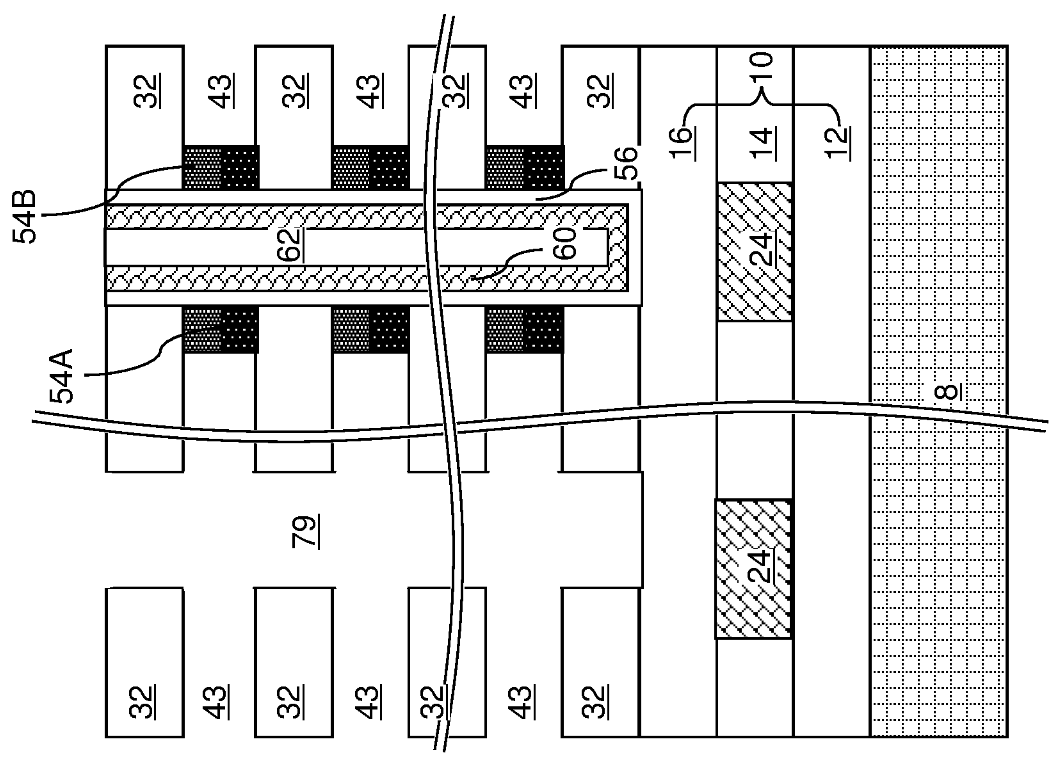
Figure 14B:
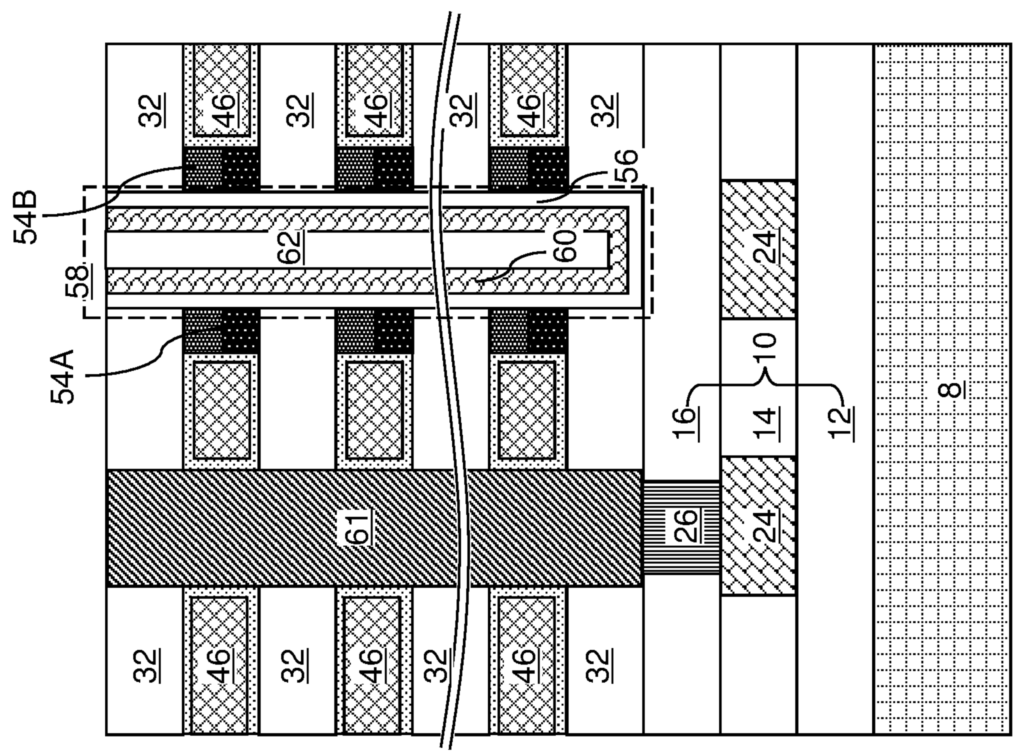
FIGS. 14A-14D are various views of the exemplary structure after formation of backside blocking dielectric layers and electrically conductive strips according to an embodiment of the present disclosure.
Figure 14A:
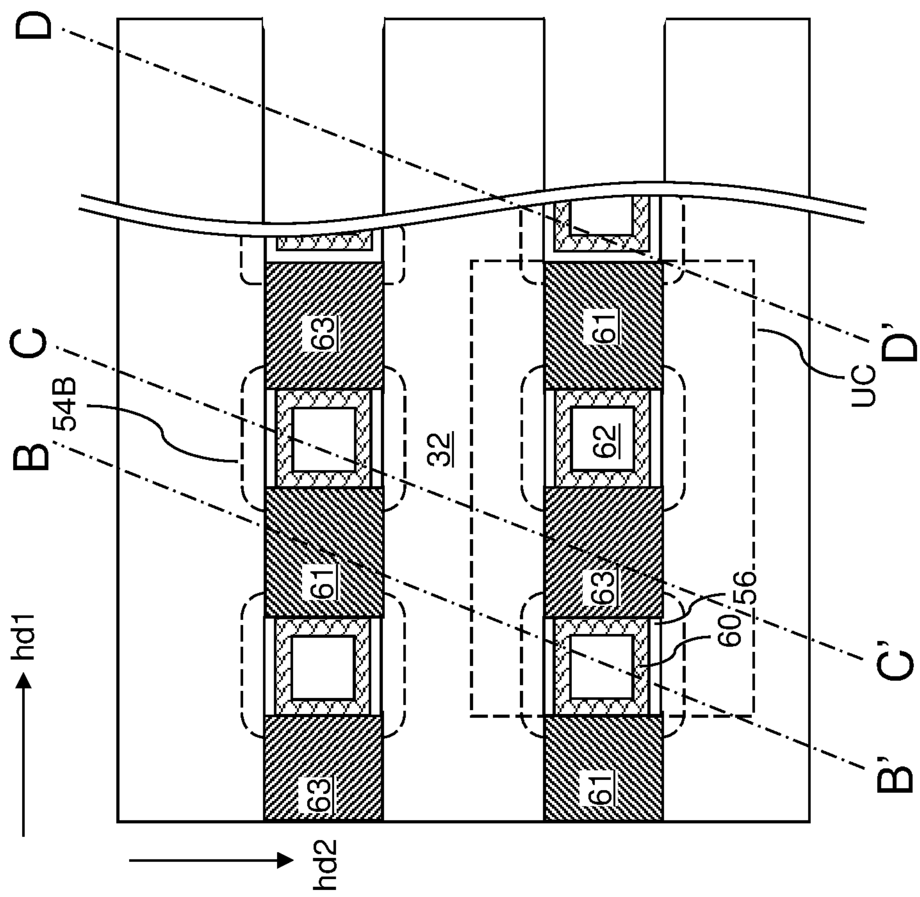
Figure 14C:
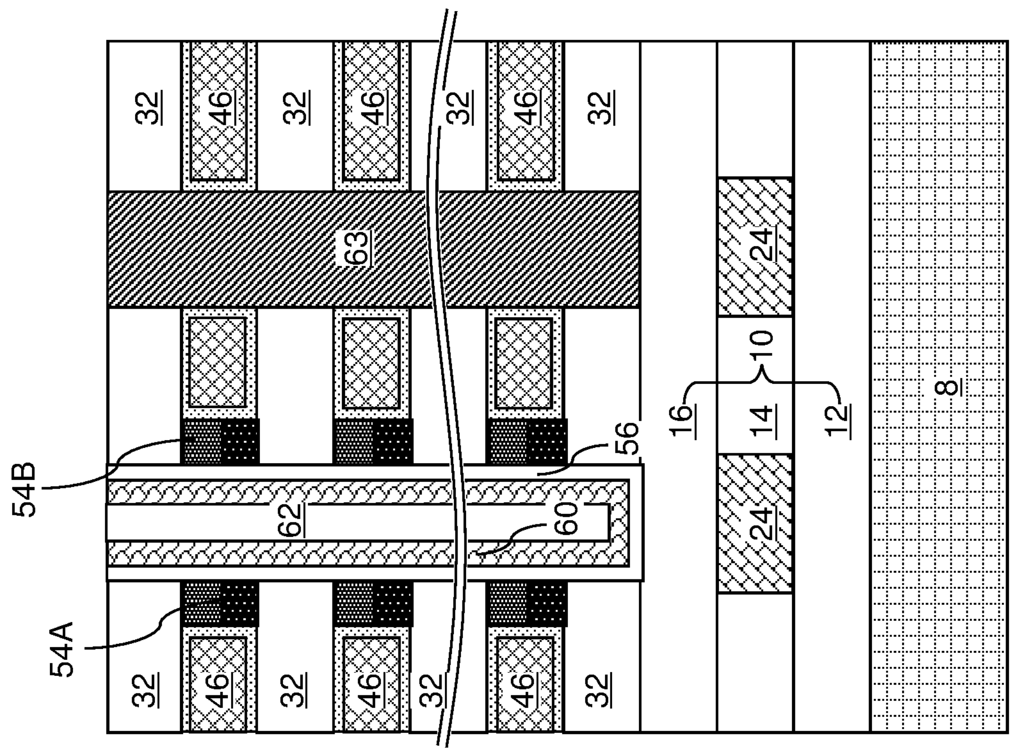
Figure 14D:
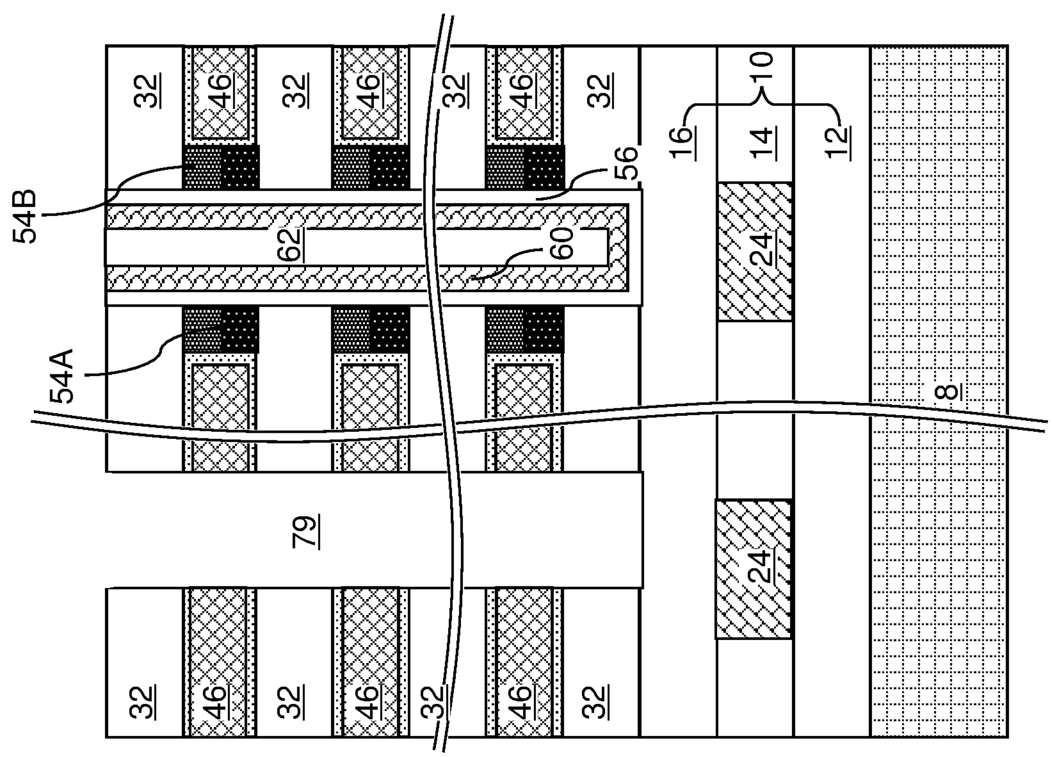
Figure 15B:
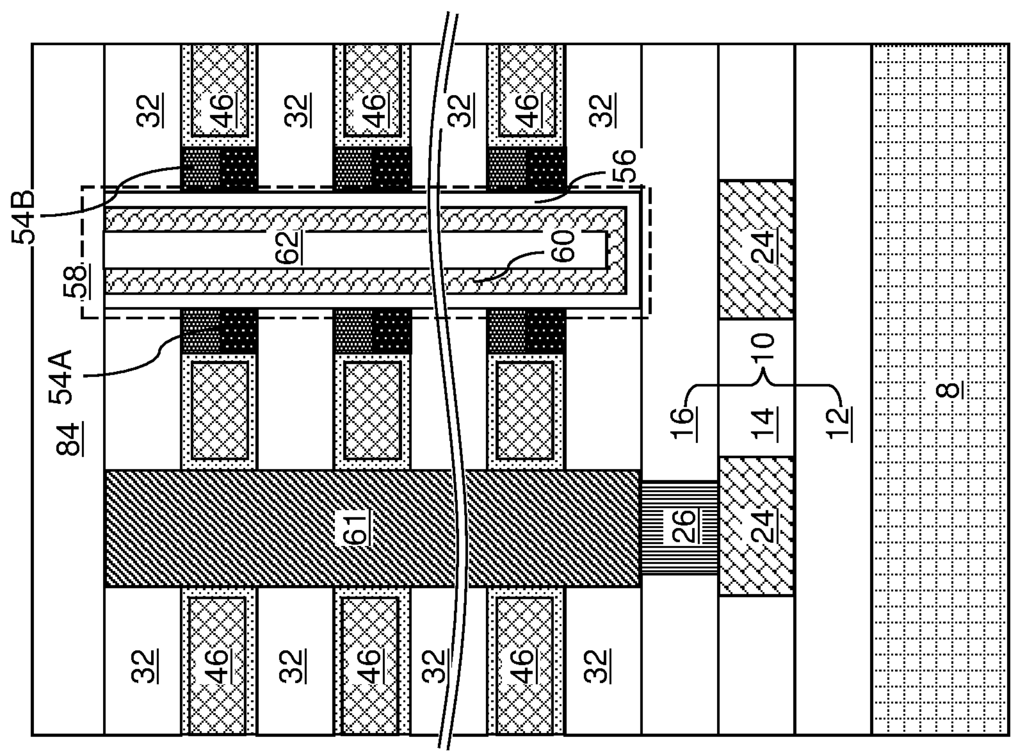
FIGS. 15A-15D are various views of the exemplary structure after formation of backside trench fill structures according to an embodiment of the present disclosure.
Figure 15A:
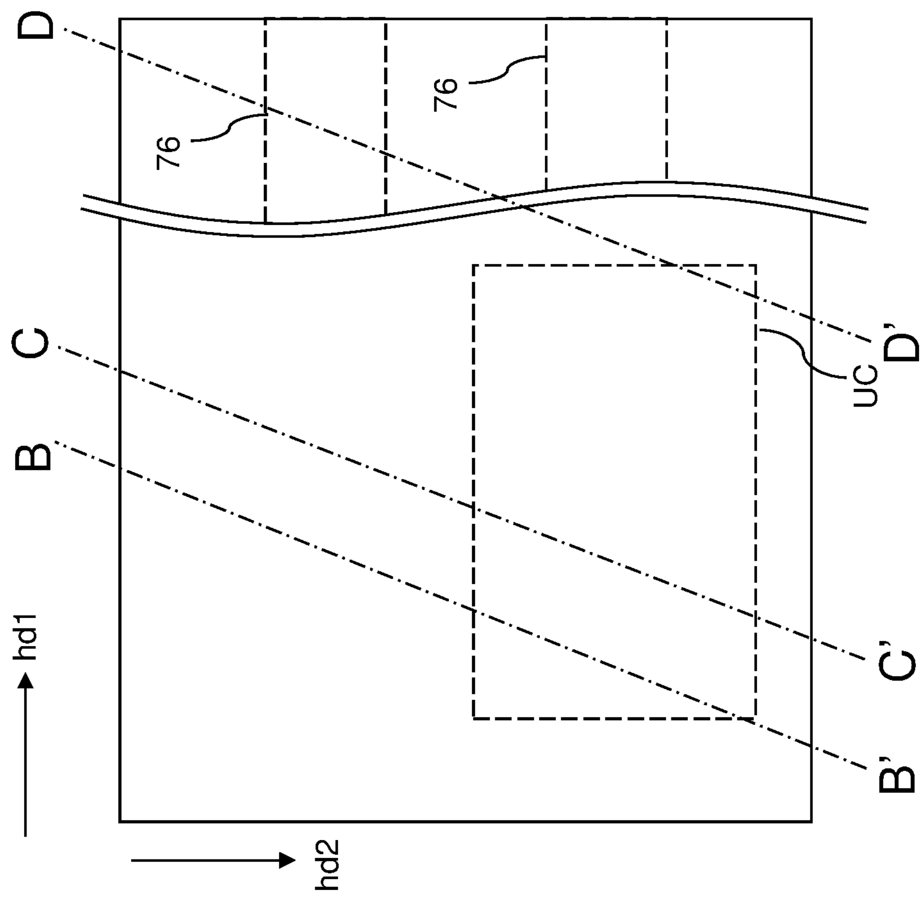
Figure 15C:
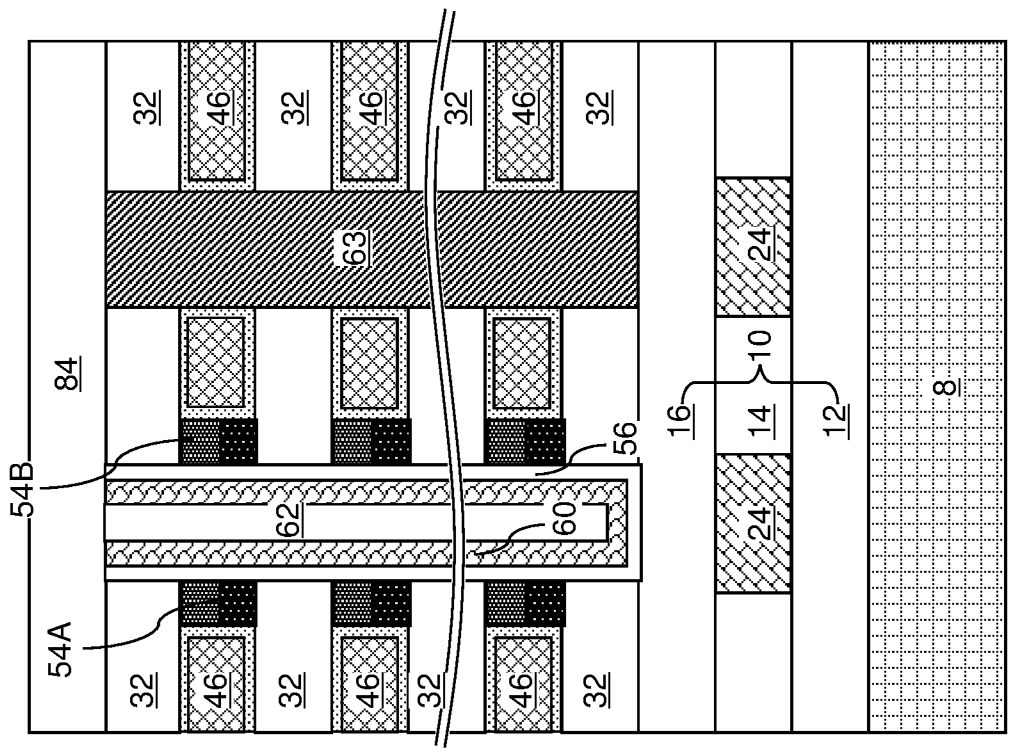
Figure 15D:
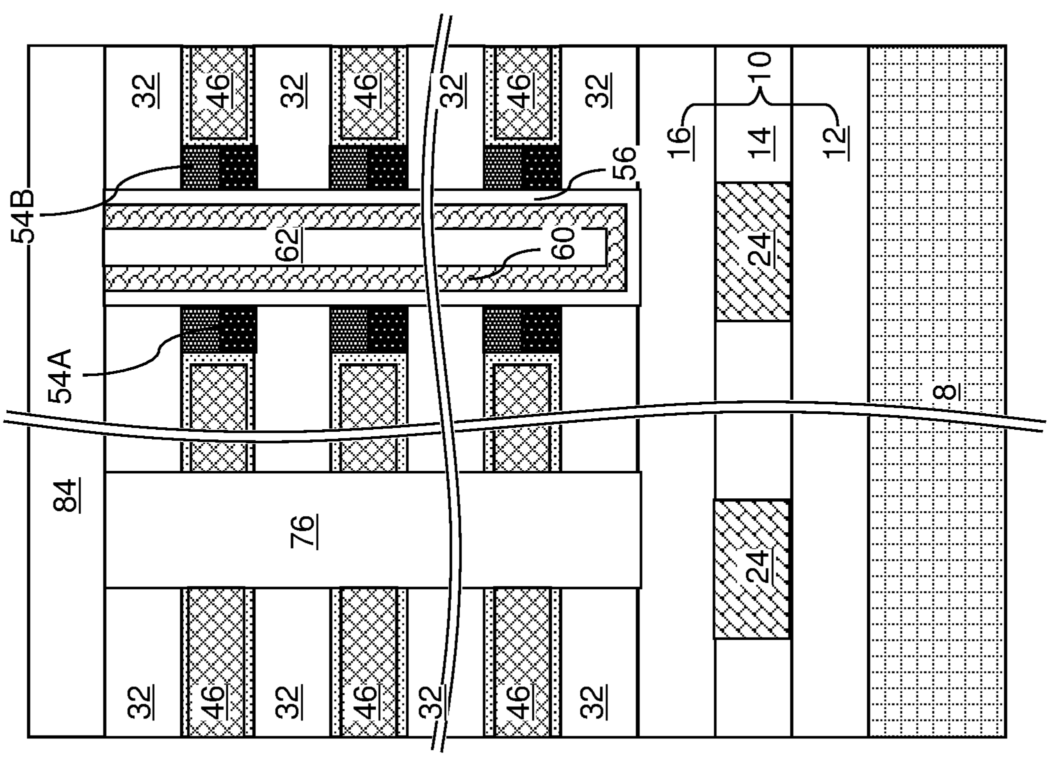
Figure 16B:
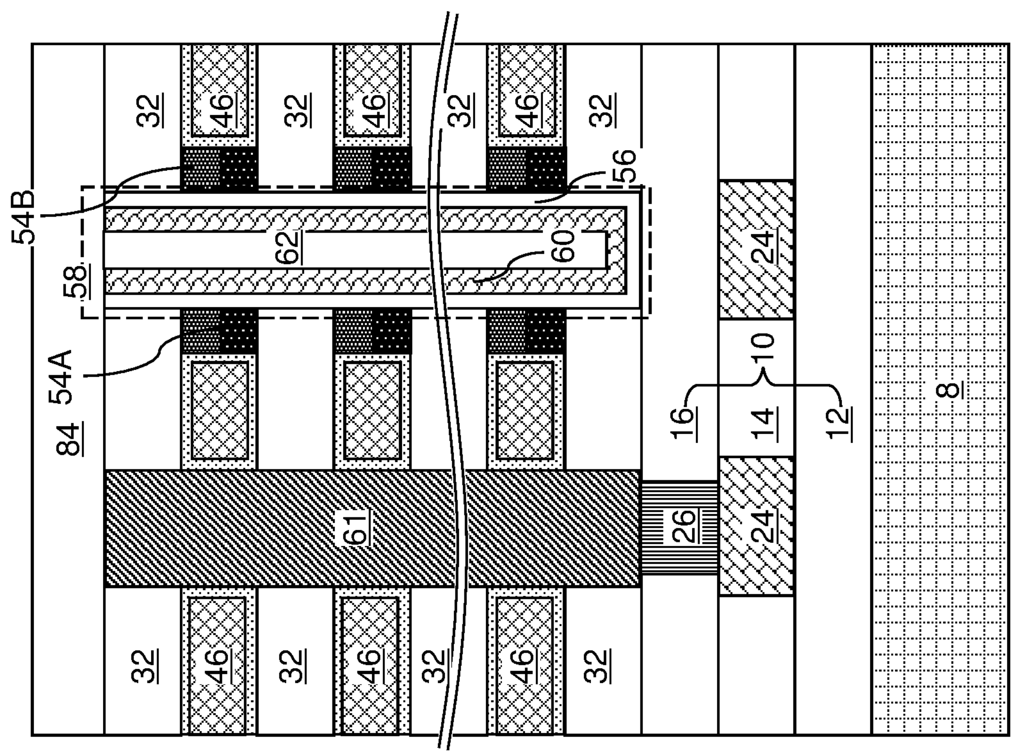
FIGS. 16A-16D are various views of the exemplary structure after formation of second connection via structures according to an embodiment of the present disclosure.
Figure 16A:
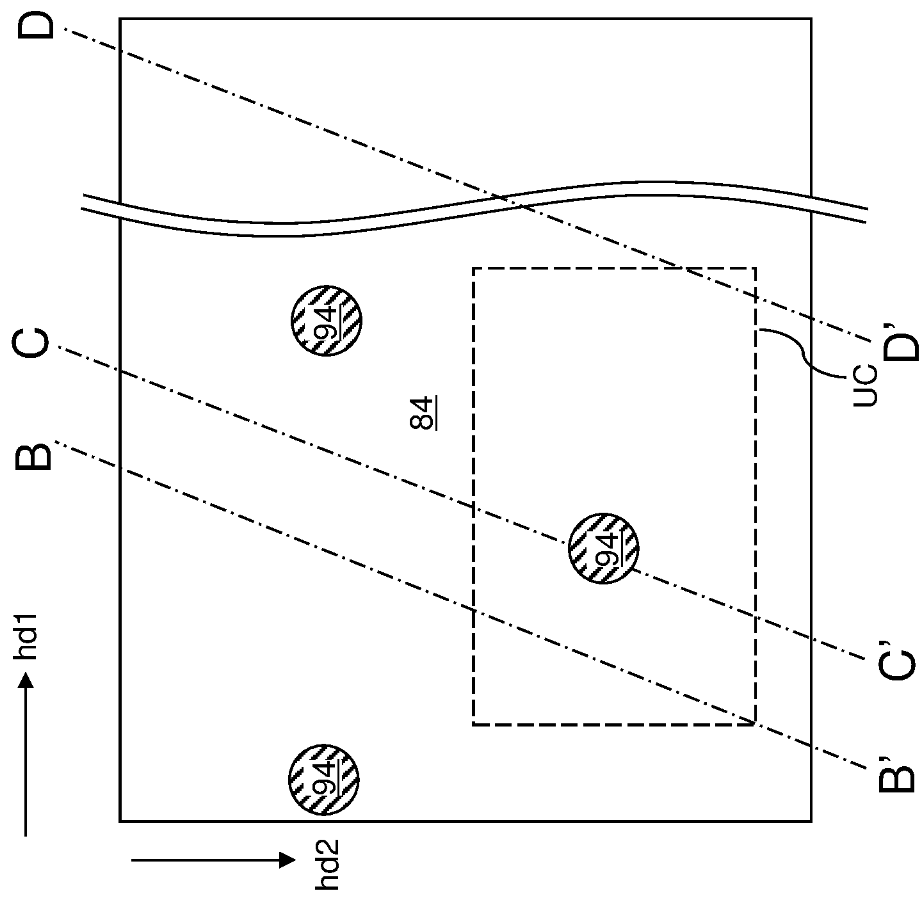
Figure 16C:
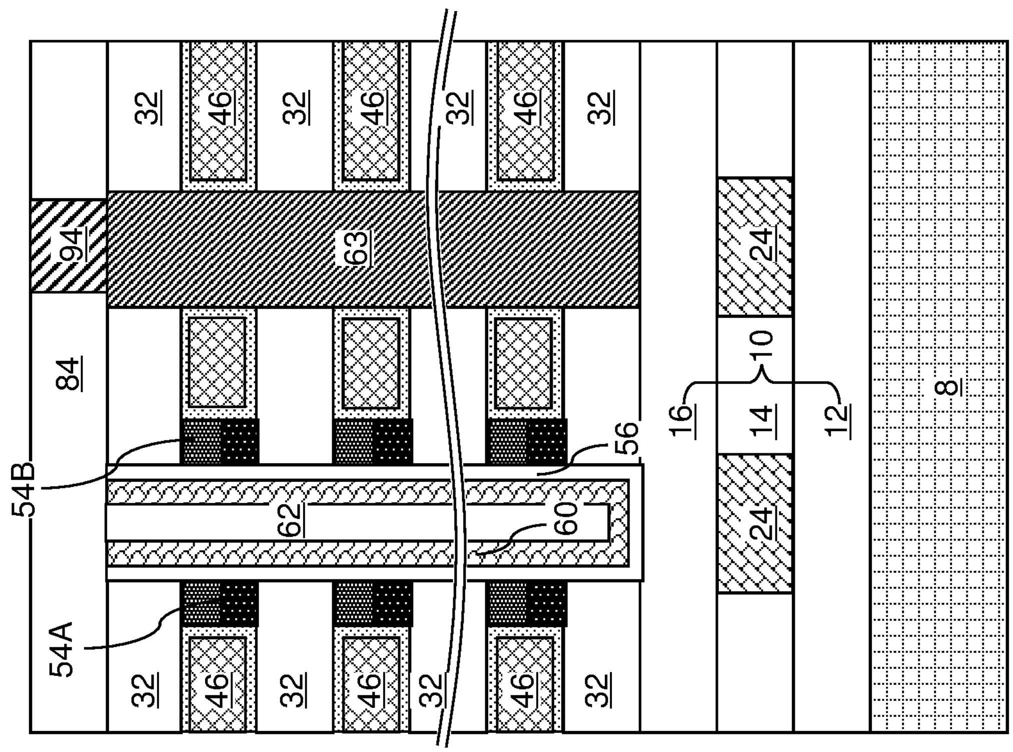
Figure 16D:
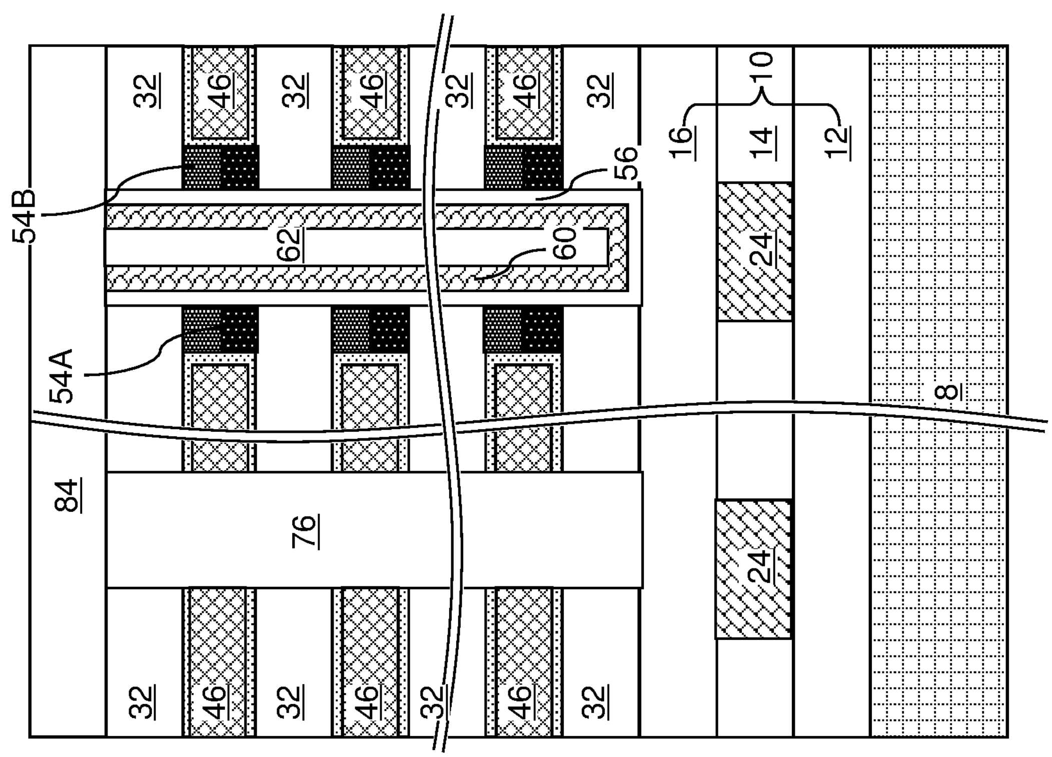
Figure 17B:
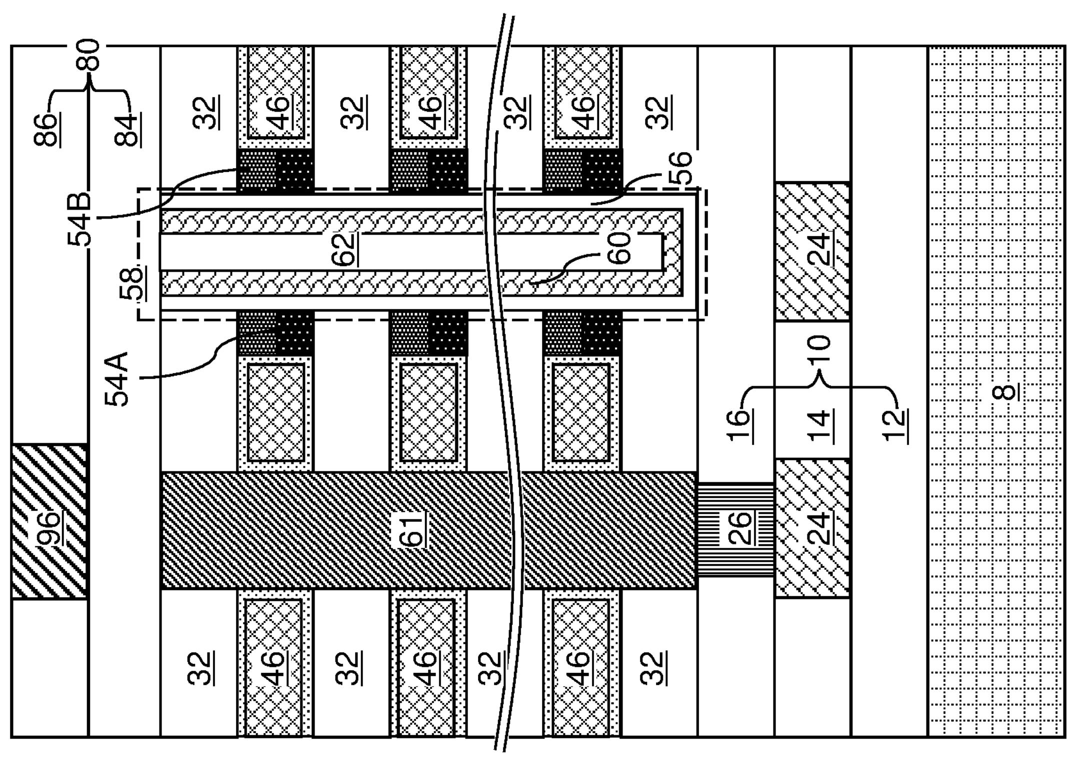
FIGS. 17A-17D are various views of the exemplary structure after formation of second access lines according to an embodiment of the present disclosure.
Figure 17A:
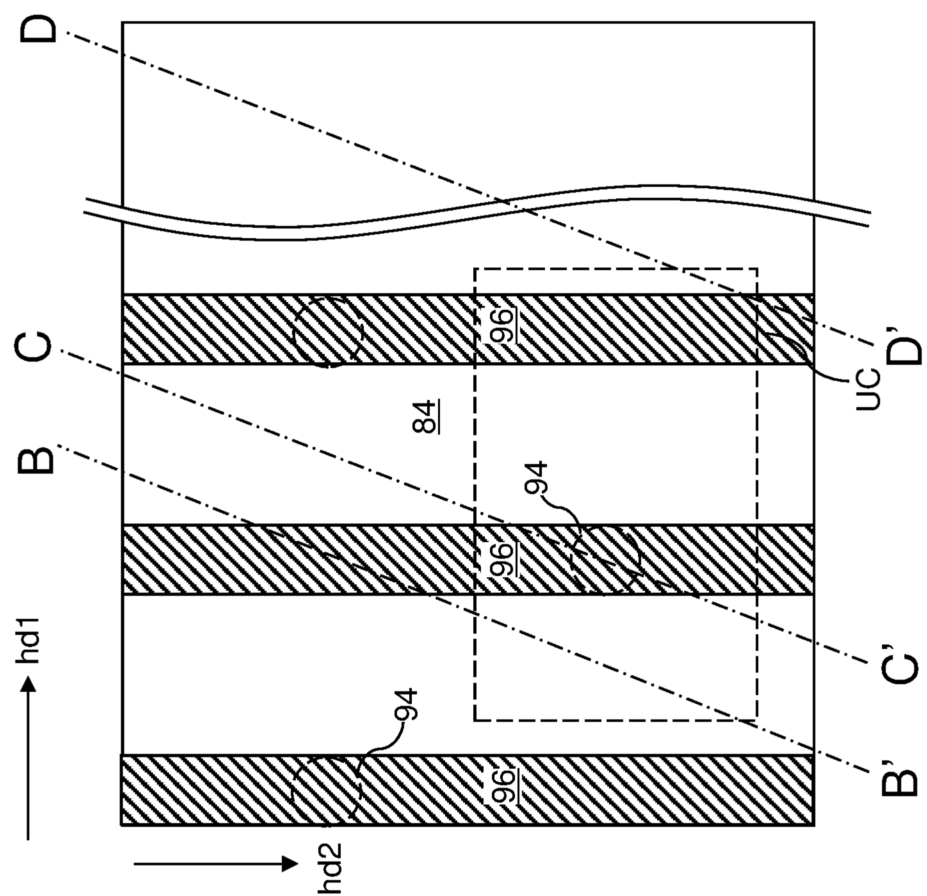
Figure 17C:
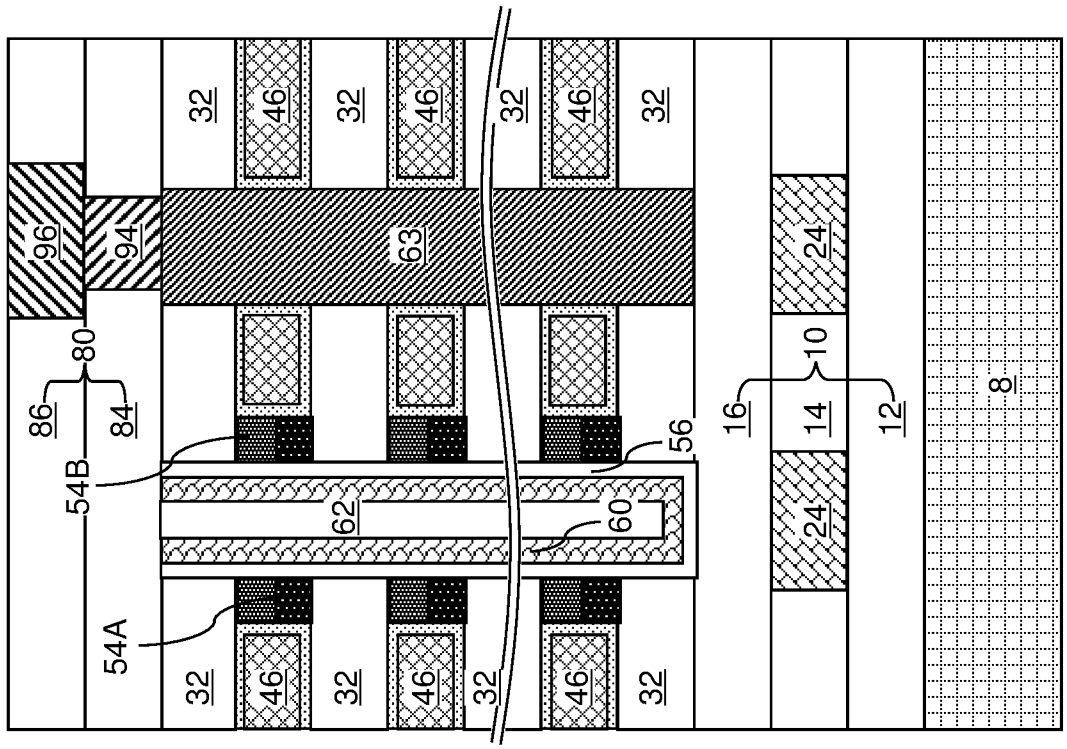
Figure 17D:
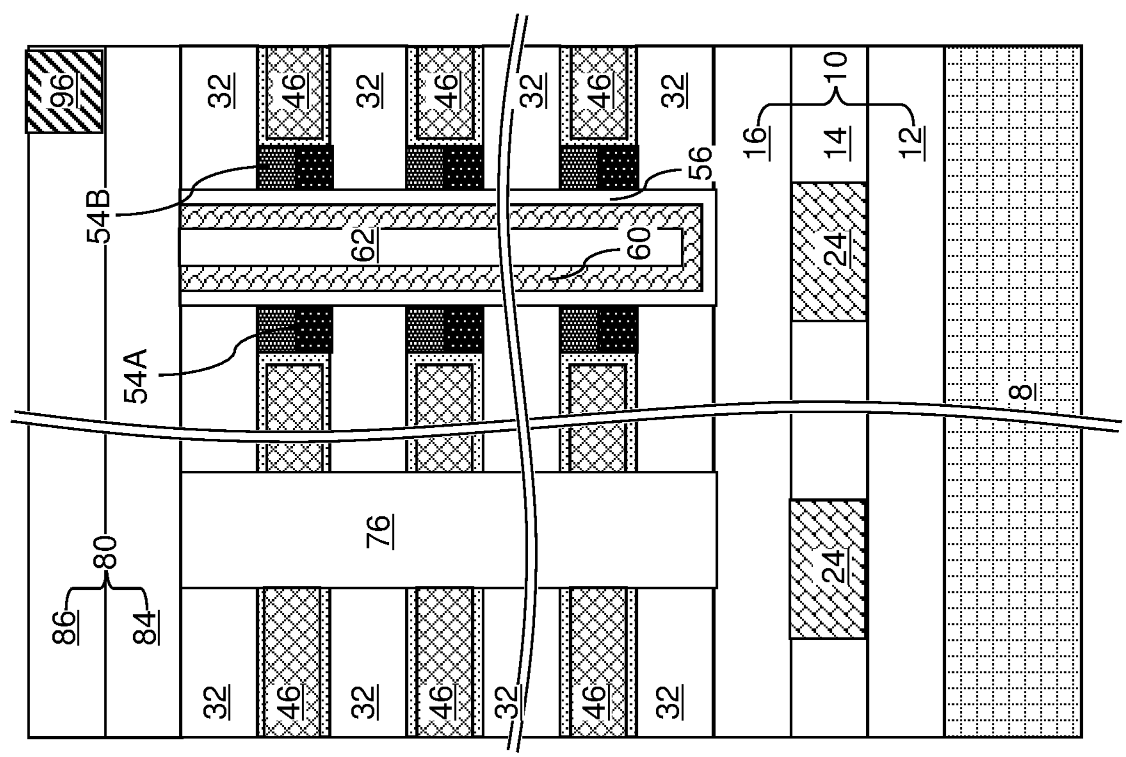
Figure 18B:
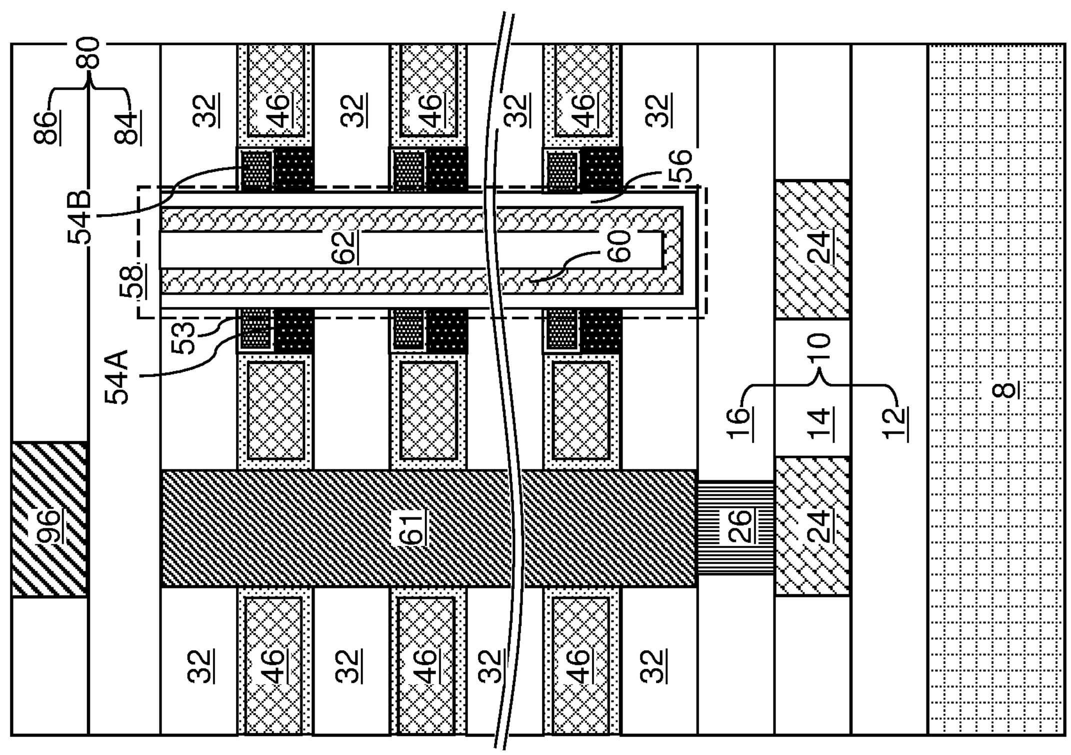
FIGS. 18A-18D are various views of an alternative configuration of the exemplary structure according to an embodiment of the present disclosure.
Figure 18A:
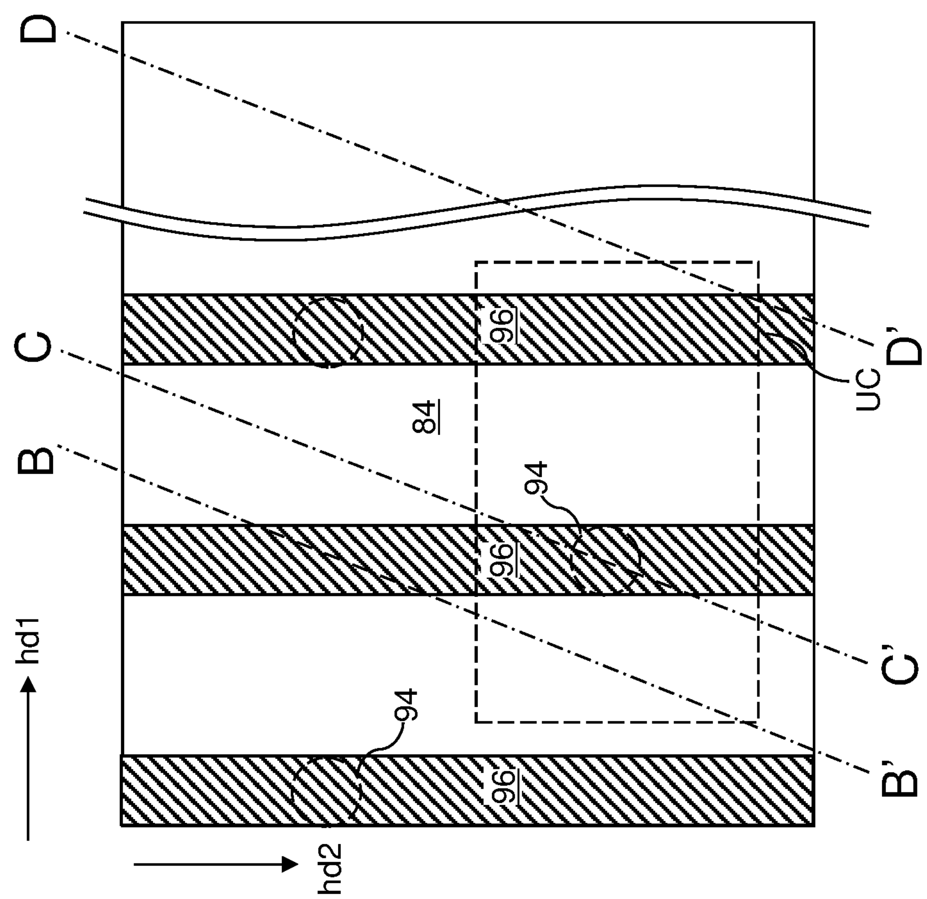
Figure 18C:
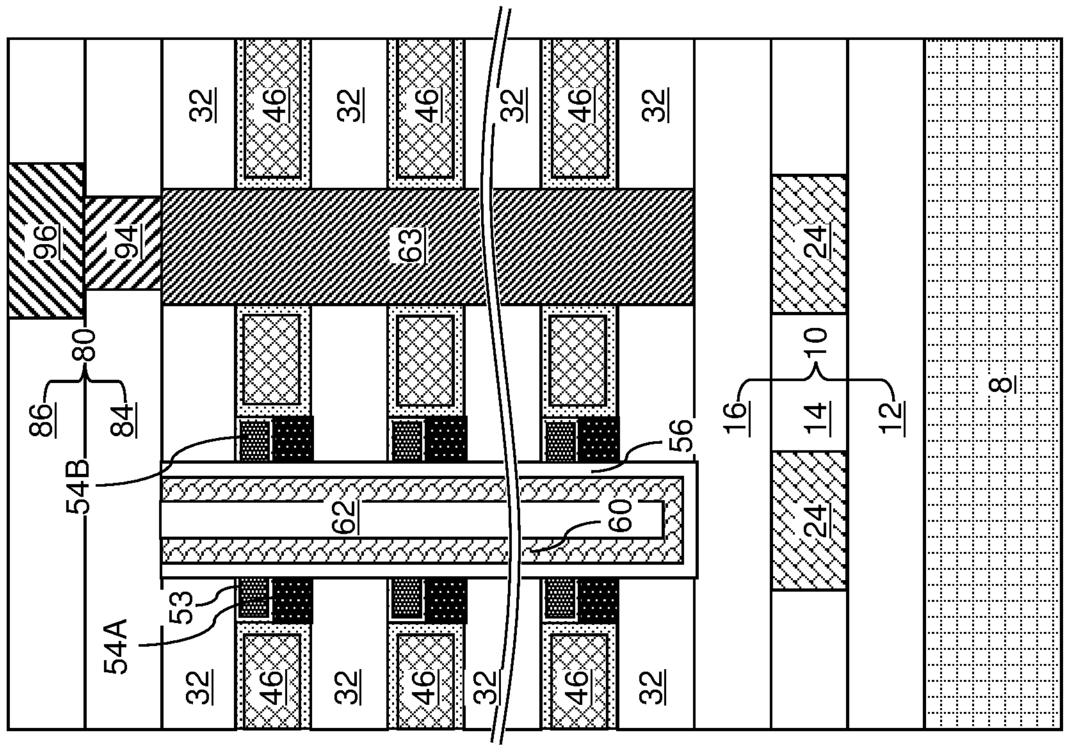
Figure 18D:
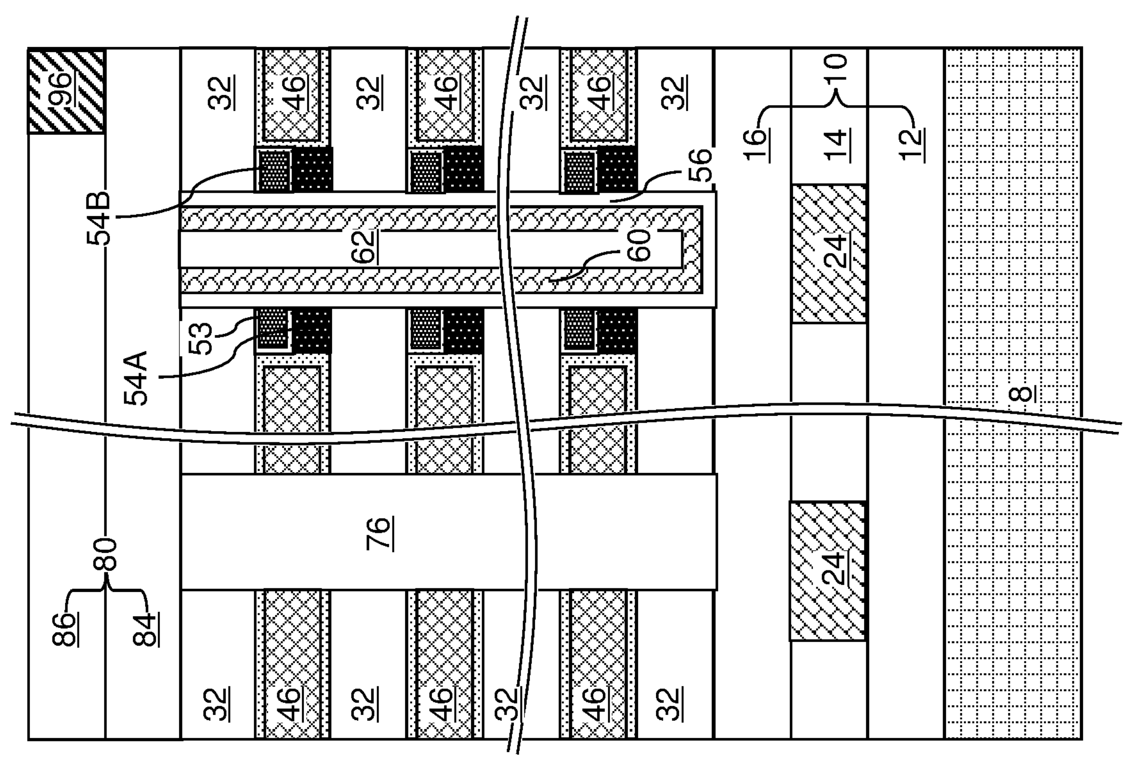

In one embodiment, the backside trenches 79 may laterally extend along the first horizontal direction hd1, as shown in FIG. 12A. In another embodiment, the backside trenches 79 may laterally extend along the second horizontal direction hd2. The locations of the backside trenches 79 can be selected such that the vertical repetition (32L, 142A, 142B) is divided into a plurality of vertical repetitions of unit strip stacks (32, 142A', 142B') that are laterally spaced apart along a horizontal direction, such as the first or the second horizontal direction. The unit strip stack (32, 142A', 142B') includes an insulating strip 32, a first sacrificial material strip 142A', and a second sacrificial material strip 142B'. Each insulating strip 32 is a patterned portion of an insulating layers 32L. Each first sacrificial material strip 142A' is a patterned portion of a first sacrificial material layer 142A. Each second sacrificial material strip 142B' is a patterned portion of a second sacrificial material layer 142B. Each vertical repetitions of unit strip stacks (32, 142A', 142B') comprises a plurality of insulating strips 32, a plurality of first sacrificial material strips 142A', and a plurality of second sacrificial material strips 142B'. In one embodiment, each vertical repetitions of unit strip stacks (32, 142A', 142B') may be located between a first combination of a first laterally-alternating sequences of transistor active region assemblies (61, 60, 63) and a first backside trench 79 and a second combination of a second laterally-alternating sequences of transistor active region assemblies (61, 60, 63) and a second backside trench 79.

Referring to FIGS. 13A-13D, backside recesses 43 can be formed by removing the first sacrificial material strips 142A' and the second sacrificial material strips 142B' (which are remaining portions of the first sacrificial material layers 142A and the second sacrificial material layers 142B) selective to the vertical stacks of memory elements (54A, 54B), the source pillar structures 61, and the drain pillar structure 63. For example, at least one selective isotropic etch process can be performed to etch the materials of the first sacrificial material strips 142A' and the second sacrificial material strips 142B' with respect to the materials of the insulating strips 32, the vertical stacks of memory elements (54A, 54B), the source pillar structures 61, and the drain pillar structure 63. In one embodiment, the first sacrificial material strips 142A' and the second sacrificial material strips 142B' comprise silicon nitride materials, and the isotropic etch process may comprise a wet etch process employing hot phosphoric acid. In another embodiment, the first sacrificial material strips 142A' and the second sacrificial material strips 142B' comprise at least one silicon-germanium alloy and optionally amorphous silicon, and the isotropic etch process may comprise a wet etch process employing hot trimethyl-2 hydroxyethyl ammonium hydroxide ("hot TMY") or tetramethyl ammonium hydroxide (TMAH). In one embodiment, each of memory elements (54A, 54B) may comprise backside surfaces that are physically exposed to a respective one of the backside recesses 43.

A plurality of backside recesses 43 can be formed in the volumes from which the sacrificial material strips (142A'. 142B') are removed. Each of the plurality of backside recesses 43 can extend substantially parallel to the top surface of the substrate 8. A backside recess 43 can be vertically bounded by a top surface of an underlying insulating strip 32 and a bottom surface of an overlying insulating strip 32.

Referring to FIGS. 14A-14D, the backside recesses 43 can be filled with backside blocking dielectric layers 44 and electrically conductive strips 46. Specifically, a backside blocking dielectric layer 44 can be deposited on physically exposed surfaces of the vertical stacks of memory elements (54A, 54B), the source pillar structures 61, and the drain pillar structures 63. The backside blocking dielectric layer 44 comprises a dielectric material that functions as a control gate dielectric for the memory elements (54A, 54B). In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed. The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition.

At least one electrically conductive material can be deposited in remaining volumes of the backside recesses 43 on the backside blocking dielectric layer 44. In one embodiment, the at least one electrically conductive material may comprise a metallic barrier material and a metallic fill material. In one embodiment, the metallic barrier layer can be deposited in the backside recesses 43 directly on the backside blocking dielectric layer 44. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

The metal fill material is deposited in the plurality of backside recesses 43, over the sidewalls of the backside trenches 79, and over the top surface of the contact level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities.

An anisotropic etch process can be performed to remove portions of the at least one electrically conductive material and the backside blocking dielectric layer 44 that are located outside the backside recesses 43, i.e., to remove portions of the at least one electrically conductive material and the backside blocking dielectric layer 44 that are located in the backside trenches 79 or above the horizontal plane including the topmost surfaces of the vertical repetitions of unit strip stacks (32, 142A', 142B'). Each remaining portion of the deposited electrically conductive material(s) in the backside recesses 43 constitutes an electrically conductive strip 46. Each electrically conductive strip 46 can be a conductive line structure, such as a word line, that laterally extends along the first horizontal direction hd1. The backside blocking dielectric layer 44 can be divided into a plurality of blocking dielectric layers 44 located within a respective backside recess 43.

Each contiguous combination of a first sacrificial material strip 142A' and a second sacrificial material strip 142B' can be replaced with a respective backside blocking dielectric layer 44 and a respective electrically conductive strip 46. Thus, remaining portions of the first sacrificial material layers 142A and the second sacrificial material layers 142B can be replaced with electrically conductive strips 46. Each memory element (54A, 54B) comprises a vertically neighboring pair of a first memory material portion 54A and a second memory material portion 54B, and is located at a level of an electrically conductive strip 46. A backside blocking dielectric layer 44 can be located between each of the memory elements (54A, 54B) and a most proximal electrically conductive strip 46 within a respective vertically-alternating stack of insulating strips 32 and electrically conducive conductive strips 46.

Referring to FIGS. 15A-15D, an insulating fill material such as undoped silicate glass or a doped silicate glass can be deposited in the backside trenches 79 and over the vertically-alternating stacks (32, 46) of insulating strips 32 and electrically conducive conductive strips 46. Portions of the insulating fill material that fill the backside trenches 79 comprise backside trench fill structures 76. Horizontally-extending portions of the insulating fill material that overlie the vertically-alternating stacks (32, 46) of insulating strips 32 and electrically conducive conductive strips 46 comprise a second via-level dielectric layer 84. The thickness of the second via-level dielectric layer 84 may be in range from 50 nm to 500 nm.

Referring to FIGS. 16A-16D, second connection via structures (e.g., drain connection via structures) 94 can be formed through the second via-level dielectric layer 84 on a respective one of the drain pillar structures 63. Each drain pillar structure 63 can be contacted by a respective one of the second connection via structures 94.

Referring to FIG. 17A-17D, a second line-level dielectric layer 86 can be formed above the second via-level dielectric layer 84. The second line-level dielectric layer 86 includes a dielectric material such as silicon oxide, and can have a thickness in a range from 50 nm to 500 nm. Line cavities laterally extending along the second horizontal direction hd2 can be formed through the second line-level dielectric layer 86. At least one conductive material can be deposited in the line cavities, and excess portions of the at least one conductive material can be removed from above the horizontal plane including the top surface of the second line-level dielectric layer 86. Remaining portions of the at least one conductive material comprise second access lines (e.g., bit lines) 96. Alternatively, the second access lines 96 may be formed first, followed by forming the second line-level dielectric layer 86 between the second access lines 96.

In case the first access lines 24 function as source lines for a three-dimensional NOR memory array, the second access lines 96 function as drain lines (i.e., bit lines) for the three-dimensional NOR memory array. In case the first access lines 24 function as drain lines for the three-dimensional NOR array, the second access lines 96 function as source lines for the three-dimensional NOR memory array. The second via-level dielectric layer 84 and the second line-level dielectric layer 86 are collectively referred to as overlying insulating layers 80.

Referring to FIGS. 18A-18D, an alternative configuration of the exemplary structure according to an embodiment of the present disclosure is illustrated. The alternative configuration of the exemplary structure can be derived from the exemplary structure by forming a combination of a memory isolation liner 53 and a second memory material portion 54B in each of the second lateral recesses 143B at the processing steps of FIGS. 8A and 8B. In other words, a combination of a memory isolation liner 53 and a second memory material portion 54B can be formed in lieu of a second memory material portion 54B in each second lateral recess 143B. Each memory element of the alternative configuration of the exemplary structure comprises a first memory material portion 54A, a memory isolation liner 53, and a second memory material portion 54B. The memory isolation liner 53 surrounds the second memory material portion 54B on three sides.

The memory elements (54A, 53, 54B) of the alternative configuration of the exemplary structure can be formed by depositing a conformal dielectric isolation material layer on the physically exposed surfaces of the exemplary structure as provided at the processing steps of FIGS. 7A and 7B, by depositing a second memory material layer in remaining volumes of the second lateral recesses 143B directly on the conformal dielectric isolation material layer, and etching portions of the second memory material layer and the conformal dielectric isolation material layer from outside the volumes of the second lateral recesses 143B by performing at least one etch back process. The at least one etch back process may comprise an anisotropic etch process. Portions of the second memory material layer and the conformal dielectric isolation material layer are removed from inside the memory openings 49 and the support openings, and from above the vertical repetition (32L, 142A, 142B). Each remaining portion of the conformal dielectric isolation material layer comprises a memory isolation liner 53. Each of the memory elements (54A, 53, 54B) comprises a respective memory isolation liner 53 located between, and electrically isolating, the first memory material portion 54A and the second memory material portion 54B. The memory isolation liners 53 includes a dielectric material such as silicon oxide and/or a dielectric metal oxide, and has a thickness in a range from 1 nm to 6 nm, such as from 2 nm to 4 nm, although lesser and greater thicknesses may also be employed.

Subsequently, the processing steps of FIGS. 9A and 9B through FIGS. 17A-17D can be performed to provide the alternative configuration of the exemplary structure illustrated in FIGS. 18A-18D.

Referring to all drawings and according to various embodiments of the present disclosure, a three-dimensional memory device includes an alternating stack of insulating layers 32 and electrically conductive layers 46, memory opening fill structures 58 extending through the alternating stack, where each of the memory opening fill structures 58 includes a vertical semiconductor channel 60, a tunneling dielectric layer 56, and a vertical stack of memory elements (54A, 54B) located at levels of the electrically conductive layers between a respective vertically neighboring pair of the insulating layers. Each of the memory elements is located at a level of a respective one of the electrically conductive layers 46 between the respective vertically neighboring pair of the insulating layers 32. Each of the memory elements includes a first memory material portion 54A, and a second memory material portion 54B that is vertically spaced from the first memory material portion. The second memory material portion has a different material composition from the first memory material portion.

In one embodiment, the first memory material portion 54A comprises an electrically conductive first floating gate and the second memory material portion 54B comprises an electrically conductive second floating gate having a different material composition from the first floating gate. In one embodiment, the first floating gate has a first work function and the second floating gate has a second work function that differs from the first work function by at least 0.5 eV, such as 0.5 eV to 2.5 eV.

In the embodiment of FIGS. 17A-17D, the first floating gate contacts the second floating gate. In the embodiment of FIGS. 18A-18D, a memory isolation liner 53 located between the first and the second floating gates. The memory isolation liner surrounds the second floating gate on three sides.

In one embodiment, the three-dimensional memory device comprises a NOR memory device. NOR memory device further comprises a source pillar 61 structure contacting a first lateral side of the semiconductor channel 61; and a drain pillar structure 63 contacting a second lateral side of the semiconductor channel 60 opposite to the first lateral side. The first and second lateral sides may extend along the second horizontal direction hd2 and may be spaced apart from each other along the first horizontal direction hd1.

In one embodiment, each of the memory elements (54A, 54B) is located between a vertically neighboring pair of insulating layers 32. In one embodiment, each of the memory elements (54A, 54B) comprises at least one horizontal surface contacting a horizontal surface of the vertically neighboring pair of insulating layers 32. In one embodiment, each of the memory elements (54A, 54B) comprises a first horizontal surface contacting a horizontal bottom surface of an overlying insulating layer 32 within the vertically neighboring pair of insulating layers, and a second horizontal surface contacting a horizontal top surface of an underlying insulating layer 32 within the vertically neighboring pair of insulating layers.

In one embodiment, the tunneling dielectric layer 56 contacts a third lateral side of the vertical semiconductor channel 60 located between the first and the second lateral side of the vertical semiconductor channel 60. A second tunneling dielectric layer 56 contacts a fourth lateral side of the vertical semiconductor channel 60 opposite to the third lateral side and a second vertical stack of memory elements (54A, 54B) contacts the second tunneling dielectric. The device also includes a second alternating stack of second insulating layers 32 and second electrically conductive layers 46, wherein the second insulating layers 32 contact the second tunneling dielectric 56. In one embodiment, a backside blocking dielectric layer 44 is located between each of the memory elements (54A, 54B) and a most proximal electrically conductive layer 46.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:

an alternating stack of insulating layers and electrically conductive layers;

memory opening fill structures extending through the alternating stack, wherein each of the memory opening fill structures comprises a vertical semiconductor channel, a tunneling dielectric layer, and a vertical stack of memory elements located at levels of the electrically conductive layers between a respective vertically neighboring pair of the insulating layers, wherein each of the memory elements is located at a level of a respective one of the electrically conductive layers between the respective vertically neighboring pair of the insulating layers, and each of the memory elements comprises:

a first memory material portion; and a second memory material portion that is vertically spaced from the first memory material portion, wherein the second memory material portion has a different material composition from the first memory material portion.

2. The three-dimensional memory device of claim 1, wherein the first memory material portion comprises an electrically conductive first floating gate and the second memory material portion comprises an electrically conductive second floating gate having a different material composition from the first floating gate.

3. The three-dimensional memory device of claim 2, wherein the first floating gate has a first work function and the second floating gate has a second work function that differs from the first work function by at least 0.5 eV.

4. The three-dimensional memory device of claim 2, wherein the first floating gate has a first work function and the second floating gate has a second work function that differs from the first work function by 0.5 eV to 2.5 eV.

5. The three-dimensional memory device of claim 2, wherein the first floating gate contacts the second floating gate.

6. The three-dimensional memory device of claim 2, further comprising a memory isolation liner located between the first and the second floating gates.

7. The three-dimensional memory device of claim 2, wherein the memory isolation liner surrounds the second floating gate on three sides.

8. The three-dimensional memory device of claim 1, wherein the three-dimensional memory device comprises a NOR memory device.

9. The three-dimensional memory device of claim 8, further comprising:

a source pillar structure contacting a first lateral side of the vertical semiconductor channel; and a drain pillar structure contacting a second lateral side of the vertical semiconductor channel opposite to the first lateral side.

10. The three-dimensional memory device of claim 9, wherein each of the memory elements is located between a vertically neighboring pair of insulating layers.

11. The three-dimensional memory device of claim 10, wherein each of the memory elements comprises at least one horizontal surface contacting a horizontal surface of the vertically neighboring pair of insulating layers.

12. The three-dimensional memory device of claim 11, wherein each of the memory elements comprises:

a first horizontal surface contacting a horizontal bottom surface of an overlying insulating layer within the vertically neighboring pair of insulating layers; and a second horizontal surface contacting a horizontal top surface of an underlying insulating layer within the vertically neighboring pair of insulating layers.

13. The three-dimensional memory device of claim 9, wherein the tunneling dielectric layer contacts a third lateral side of the vertical semiconductor channel located between the first and the second lateral sides.

14. The three-dimensional memory device of claim 13, further comprising:

a second tunneling dielectric layer contacting a fourth lateral side of the vertical semiconductor channel opposite to the third lateral side;

a second vertical stack of memory elements contacting the second tunneling dielectric; and a second alternating stack of second insulating layers and second electrically conductive layers, wherein the second insulating layers contact the second tunneling dielectric.

15. The three-dimensional memory device of claim 1, further comprising a backside blocking dielectric layer is located between each of the memory elements and a most proximal electrically conductive layer.

* * * * *